US012757715B2

(12) United States Patent
Xie et al.

(10) Patent No.: US 12,757,715 B2
(45) Date of Patent: Oct. 6, 2026

(54) METHOD AND STRUCTURE FOR FORMING LANDING FOR BACKSIDE POWER DISTRIBUTION NETWORK

(71) Applicant: INTERNATIONAL BUSINESS MACHINES CORPORATION, Armonk, NY (US)

(72) Inventors: Ruilong Xie, Niskayuna, NY (US); Alexander Reznicek, Troy, NY (US); Somnath Ghosh, Clifton Park, NY (US); Kisik Choi, Watervliet, NY (US)

(73) Assignee: International Business Machines Corporation, Armonk, NY (US)

(*) Notice: Subject to any disclaimer, the term of this patent is extended or adjusted under 35 U.S.C. 154(b) by 851 days.

(21) Appl. No.: 17/655,179

(22) Filed: Mar. 17, 2022

(65) Prior Publication Data

US 2023/0299000 A1 Sep. 21, 2023

(51) Int. Cl.
*H10W 20/41* (2026.01)
*H10D 30/67* (2025.01)
(Continued)

(52) U.S. Cl.
CPC ...... *H10W 20/427* (2026.01); *H10D 30/6735* (2025.01); *H10D 30/6757* (2025.01);
(Continued)

(58) Field of Classification Search
CPC ......... H01L 23/5286; H01L 21/823475; H01L 29/0665; H01L 29/401; H01L 29/41725;
(Continued)

(56) References Cited

U.S. PATENT DOCUMENTS 9,570,395 B1 2/2017 Sengupta
9,583,442 B2 2/2017 Fan
(Continued)

FOREIGN PATENT DOCUMENTS

EP 4187581 A1 * 5/2022 ....... H01L 21/02019
KR 20170057820 A 5/2017
(Continued)

OTHER PUBLICATIONS

Notification of Transmittal of the International Search Report and the Written Opinion of the International Searching Authority, or the Declaration, Date of mailing May 11, 2023, International application No. PCT/EP2023/054508, 11 pages.
(Continued)

*Primary Examiner* — Eva Y Montalvo
(74) *Attorney, Agent, or Firm* — Samuel A. Waldbaum

(57) ABSTRACT

A semiconductor including a first sacrificial layer located directly between a first substrate layer and a second substrate layer, where the first sacrificial layer has a first thickness. The second substrate layer has a second thickness and where the second thickness is larger than the first thickness. A source/drain located on top of the second substrate layer and a dielectric landing pad located within the first sacrificial layer. A frontside contact comprised of a first section and a second section. The first section of the frontside contact is located on top of the source/drain. The second section of the frontside contact is a via that extends downwards past and through the dielectric landing pad.

15 Claims, 21 Drawing Sheets

(51) Int. Cl.

| | |
|---|---|
| ***H10D 62/10*** | (2025.01) |
| ***H10D 64/01*** | (2025.01) |
| ***H10D 64/23*** | (2025.01) |
| ***H10D 84/01*** | (2026.01) |
| ***H10D 84/03*** | (2025.01) |

(52) U.S. Cl.
CPC ........... *H10D 62/118* (2025.01); *H10D 64/01* (2025.01); *H10D 64/251* (2025.01); *H10D 84/0149* (2025.01); *H10D 84/038* (2025.01)

(58) Field of Classification Search
CPC ......... H01L 29/42392; H01L 29/78696; H01L 21/743; H01L 21/76895; H01L 21/76898; H01L 23/481; H01L 23/535; H01L 21/76897; H01L 23/5226; H01L 23/49827; H10D 30/6735; H10D 84/0149
See application file for complete search history.

(56) References Cited

U.S. PATENT DOCUMENTS

| | | | | |
|---|---|---|---|---|
| 10,586,765 | B2 | 3/2020 | Smith | |
| 10,636,739 | B2 | 4/2020 | Beyne | |
| 10,700,207 | B2 | 6/2020 | Chen | |
| 10,720,391 | B1 * | 7/2020 | Paul | H01L 29/0653 |
| 10,886,224 | B2 | 1/2021 | Gerousis | |
| 10,985,103 | B2 | 4/2021 | Hong | |
| 11,133,249 | B2 * | 9/2021 | Kim | H01L 21/7685 |
| 11,177,286 | B2 * | 11/2021 | Kim | H01L 21/76831 |
| 11,201,106 | B2 * | 12/2021 | Chen | H01L 21/743 |
| 11,315,926 | B2 * | 4/2022 | Bae | H01L 29/7851 |
| 11,728,244 | B2 * | 8/2023 | Van Dal | H01L 29/66795 257/371 |
| 11,990,412 | B2 * | 5/2024 | Xie | H01L 21/76895 |
| 2010/0207213 | A1 * | 8/2010 | Tan | H10D 86/01 438/151 |
| 2018/0102283 | A1 * | 4/2018 | Wu | H01L 21/76807 |
| 2018/0145030 | A1 * | 5/2018 | Beyne | H01L 21/76251 |
| 2018/0294267 | A1 | 10/2018 | Licausi | |
| 2019/0221475 | A1 * | 7/2019 | Hong | H01L 21/76831 |
| 2020/0042668 | A1 | 2/2020 | Peng | |
| 2020/0135634 | A1 | 4/2020 | Chiang | |
| 2020/0219813 | A1 * | 7/2020 | Paul | H10D 64/251 |
| 2021/0028112 | A1 * | 1/2021 | Kim | H10D 84/038 |
| 2021/0035860 | A1 | 2/2021 | Dentoni Litta | |
| 2021/0043561 | A1 * | 2/2021 | Kim | H01L 21/76895 |
| 2021/0305252 | A1 | 9/2021 | Chiang | |
| 2021/0305381 | A1 | 9/2021 | Chiang | |
| 2021/0375722 | A1 * | 12/2021 | Kim | H01L 23/5286 |
| 2021/0376093 | A1 | 12/2021 | Chu | |
| 2021/0384192 | A1 * | 12/2021 | Bae | H01L 21/76883 |
| 2021/0391464 | A1 * | 12/2021 | Bae | H01L 29/0673 |
| 2021/0399098 | A1 | 12/2021 | Li | |
| 2022/0020666 | A1 * | 1/2022 | Van Dal | H01L 21/823821 |
| 2022/0085011 | A1 * | 3/2022 | Lee | H01L 27/0886 |
| 2022/0157723 | A1 * | 5/2022 | Park | H01L 23/5286 |
| 2023/0178478 | A1 * | 6/2023 | Hiblot | H01L 23/481 257/774 |
| 2023/0253293 | A1 * | 8/2023 | Cho | H01L 24/80 257/732 |
| 2023/0317596 | A1 * | 10/2023 | Kim | H01L 23/5226 257/401 |
| 2023/0335558 | A1 * | 10/2023 | Min | H01L 21/76843 |
| 2023/0402318 | A1 * | 12/2023 | Xie | H01L 21/76804 |
| 2024/0055493 | A1 * | 2/2024 | Na | H01L 29/0673 |
| 2024/0128161 | A1 * | 4/2024 | Lee | H01L 27/088 |

FOREIGN PATENT DOCUMENTS

| | | | | |
|---|---|---|---|---|
| KR | 20200049468 | A | | 5/2020 |
| KR | 20240072745 | A | * | 11/2022 |

OTHER PUBLICATIONS

Veloso et al., "Enabling Logic with Backside Connectivity via n-TSVs and its Potential as a Scaling Booster", 2021 Symposium on VLSI Technology Digest of Technical Papers, © 2021 JSAP TSF2-6, 2 pages.

Gupta et al., "Buried Power Rail Integration with Si FinFETs for CMOS Scaling beyond the 5 nm Node", 2020 Symposium on VLSI Technology Digest of Technical Papers, THL.6, IEEE 2020, 2 pages.

Prasad et al., "Buried Power Rails and Back-side Power Grids: Arm© CPU Power Delivery Network Design Beyond 5nm", IEDM19-446, © 2019 IEEE, pp. 19.1.1-19.1.4.

* cited by examiner

METHOD AND STRUCTURE FOR FORMING LANDING FOR BACKSIDE POWER DISTRIBUTION NETWORK

BACKGROUND

The present invention generally relates to the field of backside power distribution networks, and more particularly to formation of a landing to facilitate the connection to the backside power distribution network.

Nanosheet is the lead device architecture in continuing CMOS scaling. However, nanosheet technology has shown issues when scaling down such that as the devices become smaller and closer together, they are interfering with each other. Furthermore, as the devices become smaller and closer together forming the connections to a backside power network is becoming more difficult.

BRIEF SUMMARY

Additional aspects and/or advantages will be set forth in part in the description which follows and, in part, will be apparent from the description, or may be learned by practice of the invention.

A semiconductor including a first sacrificial layer located directly between a first substrate layer and a second substrate layer, where the first sacrificial layer has a first thickness. The second substrate layer has a second thickness and where the second thickness is larger than the first thickness. A source/drain located on top of the second substrate layer and a dielectric landing pad located within the first sacrificial layer. A frontside contact comprised of a first section and a second section. The first section of the frontside contact is located on top of the source/drain. The second section of the frontside contact is a via that extends downwards past and through the dielectric landing pad.

A semiconductor including a first sacrificial layer located directly between a first substrate layer and a second substrate layer, where the first sacrificial layer has a first thickness. The second substrate layer has a second thickness, and where the second thickness is larger than the first thickness. A source/drain located on top of the second substrate layer and a dielectric landing pad located within the first sacrificial layer. A frontside contact comprised of a first section and a second section. The first section of the frontside contact is located on top of the source/drain. The second section of the frontside contact is a via that extends downwards towards the dielectric landing pad. A bottom surface of the second section of the frontside contact forms a uniforms surface with a bottom surface of the dielectric landing pad.

A method includes forming a first sacrificial layer located on a first substrate layer, where the first sacrificial layer has a first thickness. Forming a second substrate layer on top of the first sacrificial layer. The second substrate has a second thickness, and the second thickness is larger than the first thickness. Forming alternating layers, where the alternating layers are comprised of a sacrificial layer and a nanosheet. Forming a hardmask on top of the alternating layers and patterning the alternating layers to form a plurality of columns. Forming a shallow trench isolation layer between each of the plurality of columns. Forming a contact trench in the shallow trench isolation layer. The contact trench extends downwards through the second substrate layer, through the first dielectric layer, and into the first substrate layer. Recessing the first sacrificial layer to create a landing pad void. The landing pad void extends horizontally from where the contact trench passes through the first sacrificial layers. Forming a dielectric liner on the sidewalls of the contact trench, such that the dielectric liner fills landing pad void to create a dielectric landing pad. Recessing the alternating layers and forming a source/drain in the space created by recessing the alternating layers. Forming a frontside contact, where the frontside contact is comprised of a first section and a second section. The first section of the frontside contact is located on top of the source/drain. The second section of the frontside contact is a via that extends downwards past and through the dielectric landing pad. The via is the contact trench filled with material forming the frontside contact.

BRIEF DESCRIPTION OF THE DRAWINGS

The above and other aspects, features, and advantages of certain exemplary embodiments of the present invention will be more apparent from the following description taken in conjunction with the accompanying drawings, in which.

DETAILED DESCRIPTION

Figure 1:
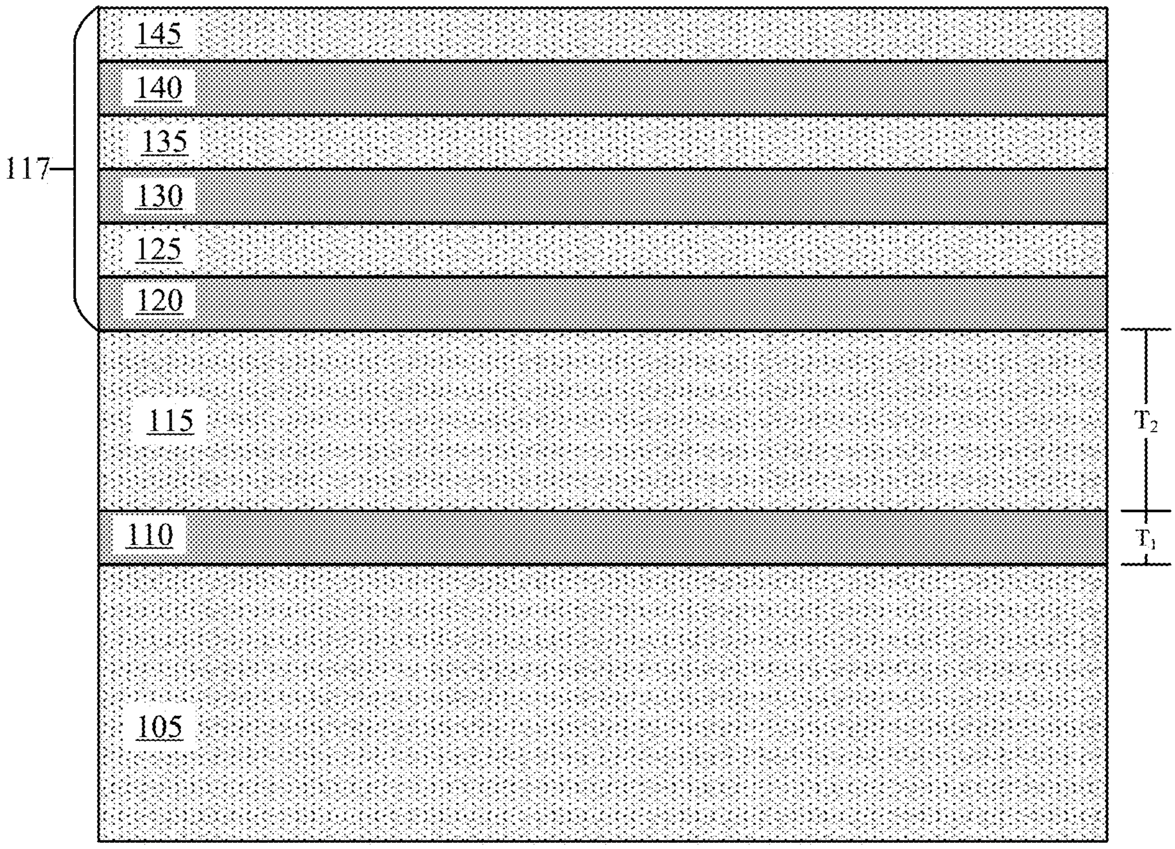
FIG. 1 illustrates a cross section of the nano device after the formation of the nano stack, in accordance with the embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art o affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, where intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various processes are used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, where like reference numerals refer to like elements throughout. The present invention is directed to forming a landing pad for the connector between the nanodevice and the backside power network. Prior to forming a nano stack comprised of alternating layers of a nanosheet and a sacrificial layer, a sacrificial layer is formed sandwiched between two sections of the substrate. A top section of substrate is formed on top of the sacrificial layer to support the formation of the nanodevice. When forming a first connector to the backside power rail, a portion of the sacrificial layer is removed and replaced with a dielectric landing pad. When etching a trench in the backside of the substrate to allow for the formation of a backside connector, then the dielectric landing pad acts as an etch stop for the etching process. The dielectric landing pad further allows for the creation of a bigger backside connector because the risk of over etching is removed.

FIG. 1 illustrates a cross section of the nano device after the formation of the nano stack 117, in accordance with the embodiment of the present invention. The nano device includes a substrate 105, a first sacrificial layer 110, a second substrate layer 115, and a nano stack 117. The substrate 105 and the second substrate layer 115 can be, for example, a material including, but not necessarily limited to, silicon (Si), silicon germanium (SiGe), Si:C (carbon doped silicon), carbon doped silicon germanium (SiGe:C), III-V, II-V compound semiconductor or another like semiconductor. In addition, multiple layers of the semiconductor materials can be used as the semiconductor material of the substrate 105. In some embodiments, the substrate 105 and the second substrate layer 115 includes both semiconductor materials and dielectric materials. The semiconductor substrate 105 and the second substrate layer 115 may also comprise an organic semiconductor or a layered semiconductor such as, for example, Si/SiGe, a silicon-on-insulator or a SiGe-on-insulator. A portion or the entire semiconductor substrate 105 may also be comprised of an amorphous, polycrystalline, or monocrystalline. The semiconductor substrate 105 and the second substrate layer 115 may be doped, undoped or contain doped regions and undoped regions therein.

The first sacrificial layer 110 is formed on top of the substrate 105. The first sacrificial layer 110 has a thickness $T_1$. The first sacrificial layer 110 can be comprised of, for example, SiGe, where Ge is in the range of about 15% to 35%. The second substrate layer 115 is formed on top of the first sacrificial layer 110. The second substrate layer 115 has a thickness of $T_2$, where the thickness $T_2$ is larger than thickness $T_1$. The nano stack 117 is formed on top of the second substrate layer 115. The nano stack 117 includes a plurality of sacrificial layers and a plurality of nanosheets. The plurality of sacrificial layers includes the second sacrificial layer 120, the third sacrificial layer 130, and the fourth sacrificial layer 140. Each of the sacrificial layers of the plurality of sacrificial layers can be comprised of, for example, SiGe, where Ge is in the range of about 15% to 35%. The plurality of nanosheets can include the first nanosheet 125, the second nanosheet 135, and the third nanosheet 145. The first nanosheet 125, the second nanosheet 135, and the third nanosheet 145 can be comprised of, for example, Si. The number of nanosheets and sacrificial layers illustrated here is for example purposes only. There can be more or fewer nanosheets and sacrificial layers then the number that is illustrated in FIG. 1 or described herein.

Figure 2:
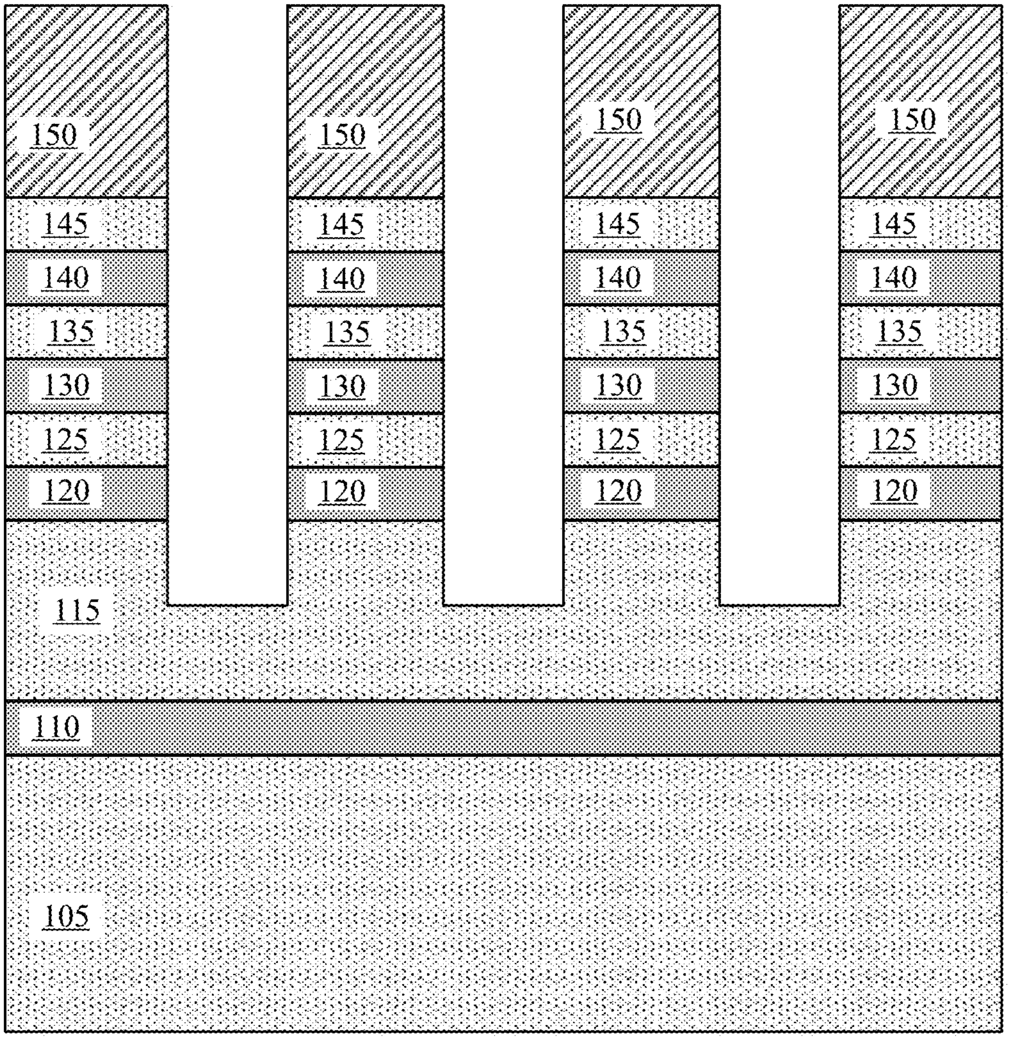
FIG. 2 illustrates a cross section of the nano device after a patterning step, in accordance with the embodiment of the present invention.

FIG. 2 illustrates a cross section of the nano device after a patterning step, in accordance with the embodiment of the present invention. A hardmask 150 is formed on top of the third nanosheet 145. The patterning forms trenches in the nano stack 117, so that the nano stack 117 is cut into a plurality of columns. The trenches extend downwards into the second substrate layer 115. The trenches do not reach the first sacrificial layer 110.

Figure 3:
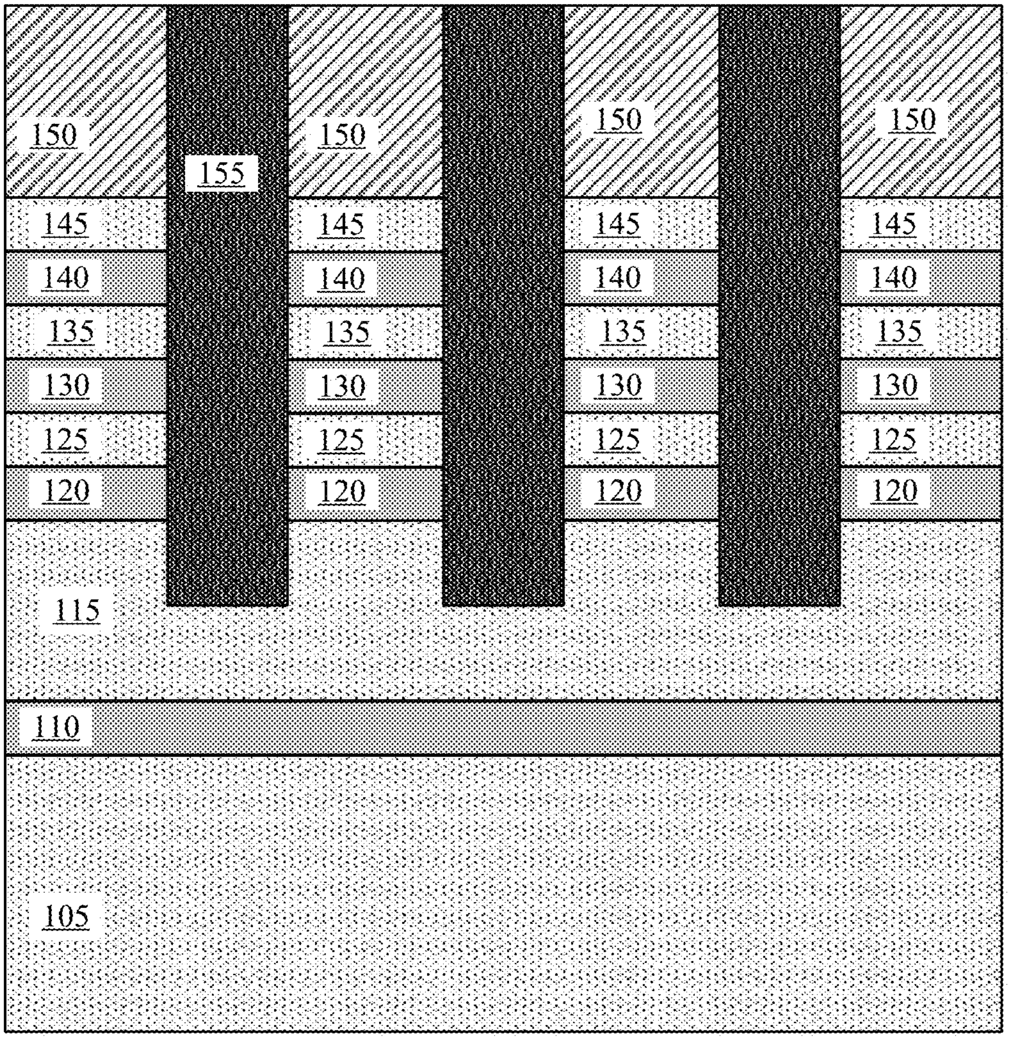
FIG. 3 illustrates a cross section of the nano device after the formation of a shallow trench isolation layer, in accordance with the embodiment of the present invention.
Figure 4:
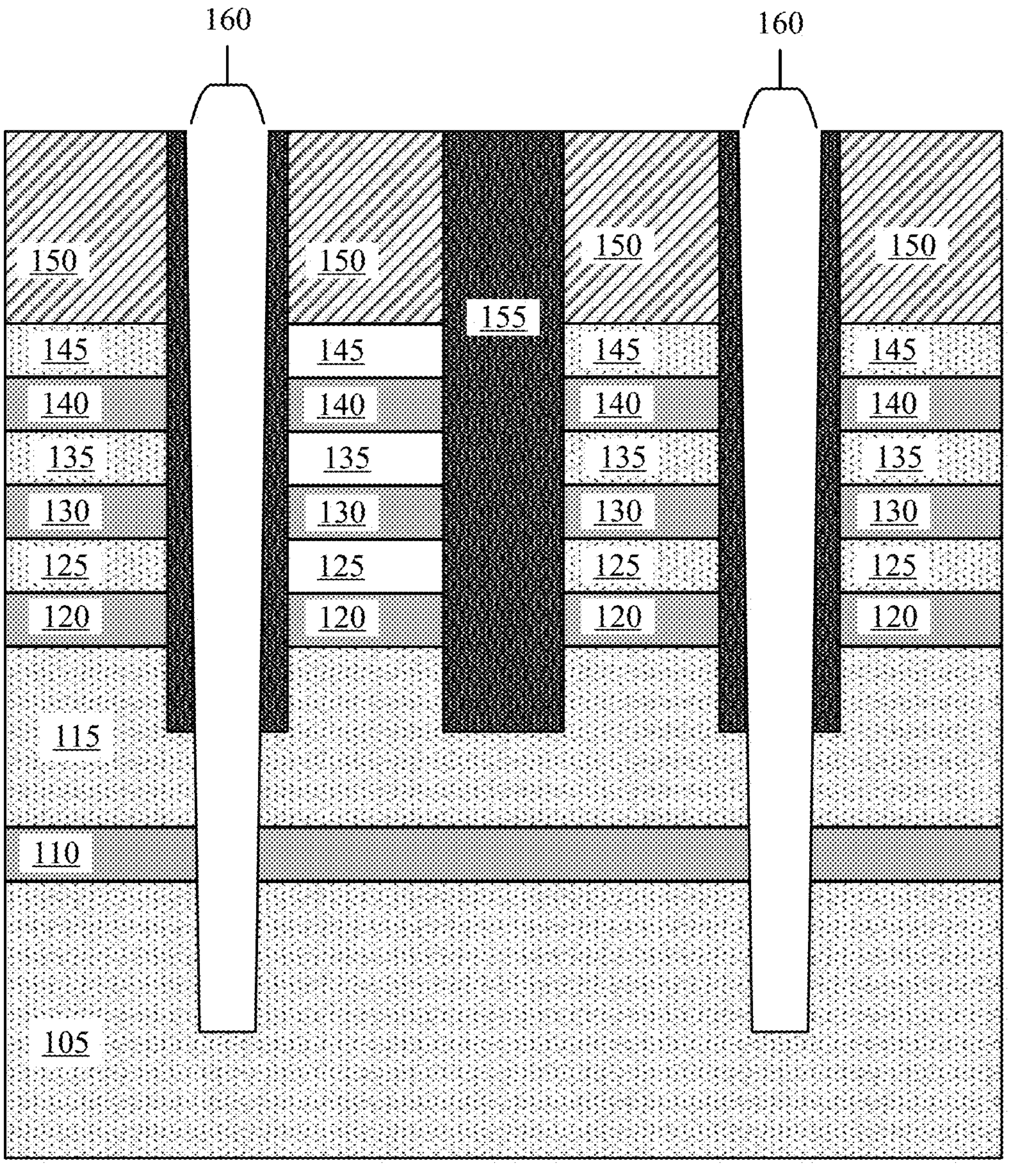
FIG. 4 illustrates a cross section of the nano device after the formation of a first trench, in accordance with the embodiment of the present invention.

FIG. 3 illustrates a cross section of the nano device after the formation of a shallow trench isolation layer 155, in accordance with the embodiment of the present invention. A shallow trench isolation layer 155 is formed in the trenches between the columns. FIG. 4 illustrates a cross section of the nano device after the formation of a first trench 160, in accordance with the embodiment of the present invention. A first trench 160 is formed in the shallow trench isolation layer 155 located between columns of the nano stack 117. The first trench 160 extends from the top of the hardmask 150 downwards into the substrate 105. The first trench 160 extends through the second substrate layer 115 and the first sacrificial layer 110. The first trench 160 extends past the first sacrificial layer 110 into the substrate 105. The first trench 160 exposes sidewalls of the first sacrificial layer 110.

Figure 5:
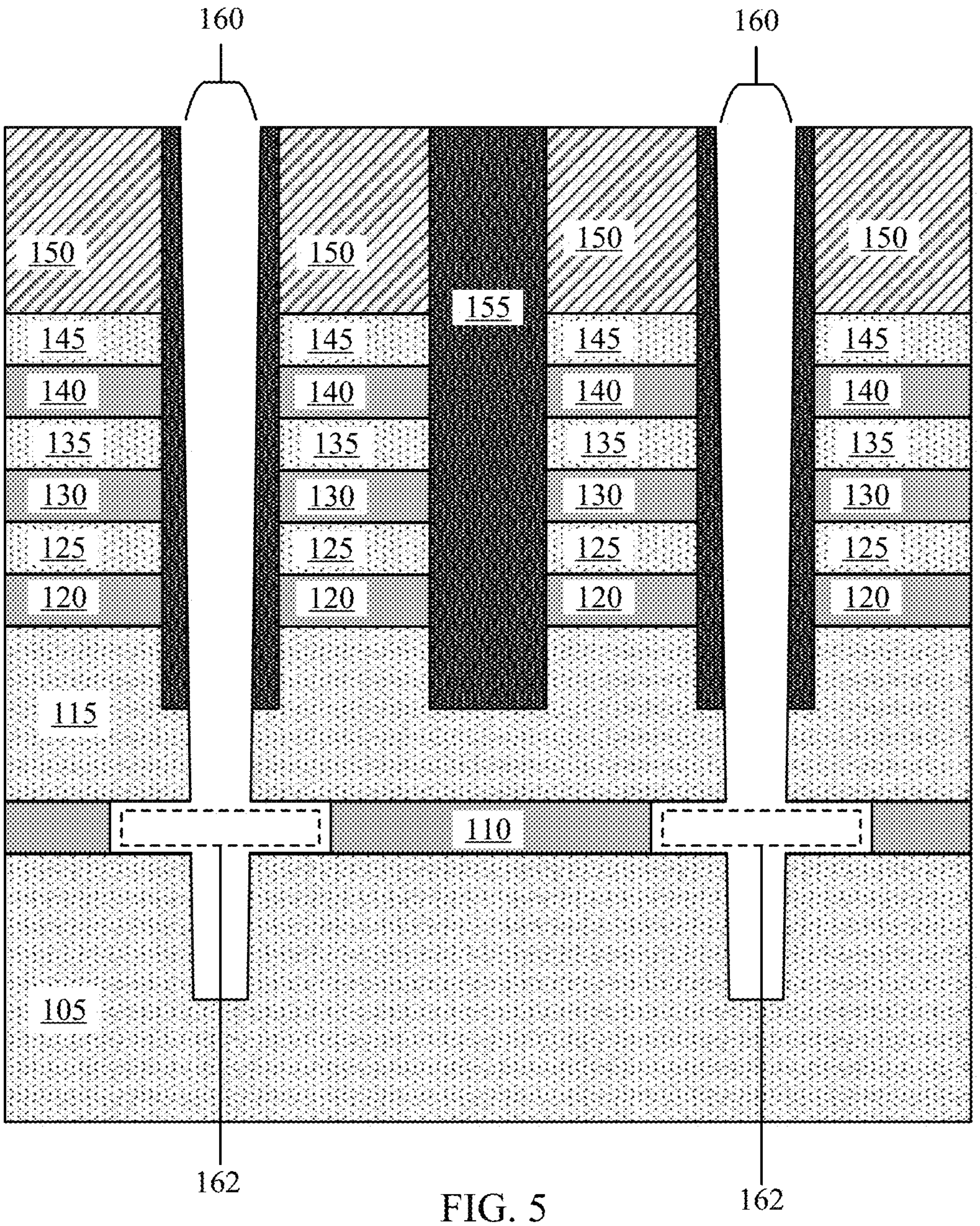
FIG. 5 illustrates a cross section of the nano device after the recessing the first sacrificial layer, in accordance with the embodiment of the present invention.
Figure 6:
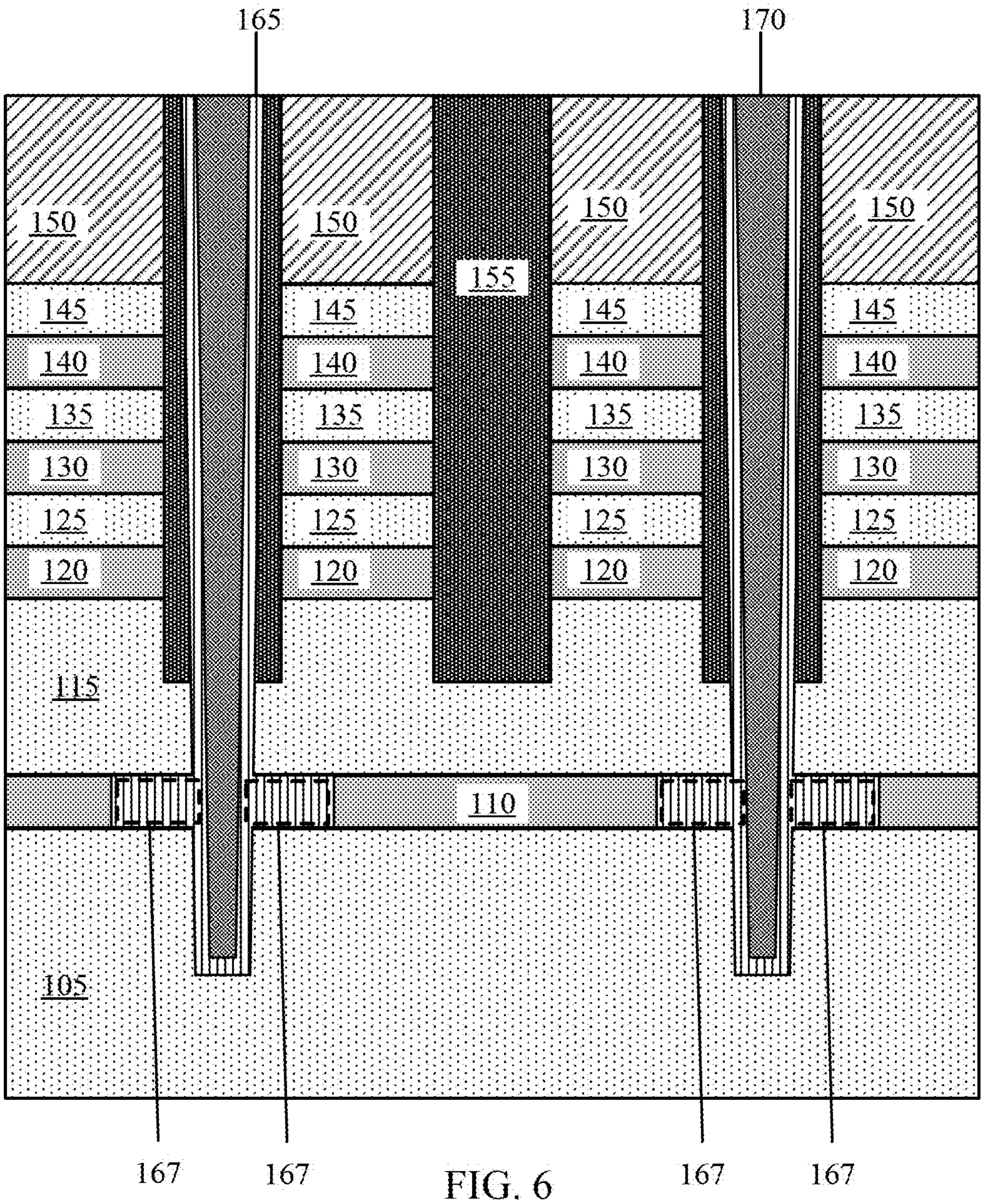
FIG. 6 illustrates a cross section of the nano device after the formation of a dielectric liner and a first connector, in accordance with the embodiment of the present invention.

FIG. 5 illustrates a cross section of the nano device after the recessing the first sacrificial layer 110, in accordance with the embodiment of the present invention. The first sacrificial layer 110 is recessed to create void 162 (as illustrated in FIG. 5 by the dashed box). The void 162 is connected to the first trench 160, such that, a plus shaped intersection is created by the meeting of these two components. FIG. 6 illustrates a cross section of the nano device after the formation of a dielectric liner 165 and a first connector 170, in accordance with the embodiment of the present invention. A dielectric liner 165 is formed on the walls of the first trench 160 and the dielectric liner 165 fills the void 162 to create the dielectric landing pad 167. The dielectric landing pad 167 extends horizontally from the intersection with a first connector. A first connector 170 is formed in the space within the first trench 160 not filled by the dielectric liner 165.

Figure 7:
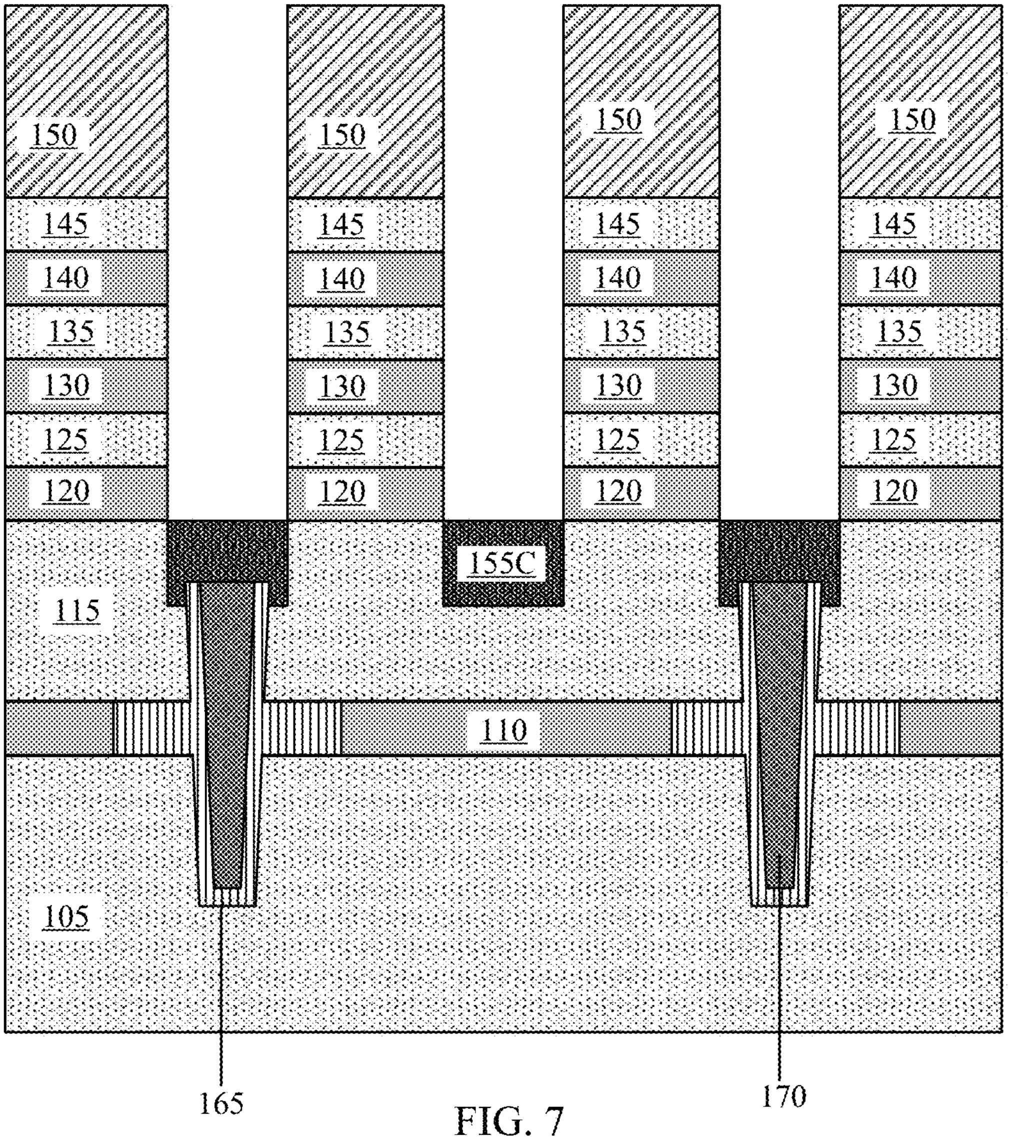
FIG. 7 illustrates a cross section of the nano device after the recessing the bottom power rail connector and filling in with a shallow trench isolation layer, in accordance with the embodiment of the present invention.

FIG. 7 illustrates a cross section of the nano device after the recessing the bottom power rail connector and filling in with a shallow trench isolation layer 155C, in accordance with the embodiment of the present invention. The bottom rail connector includes the first connector 170, the dielectric liner 165, and the dielectric landing pad 167. The bottom rail connector is recessed so that the top of the dielectric liner 165 and the top of the first connector 170 is located lower than the bottom surface of the second sacrificial layer 120. Portions of the shallow trench isolation layer 155 is removed during the recessing of the bottom power rail connector, such that, additional shallow trench isolation layer 155C is formed after the recessing process to cover the top surface of the dielectric liner 165 and the first connector 170.

Figure 8:
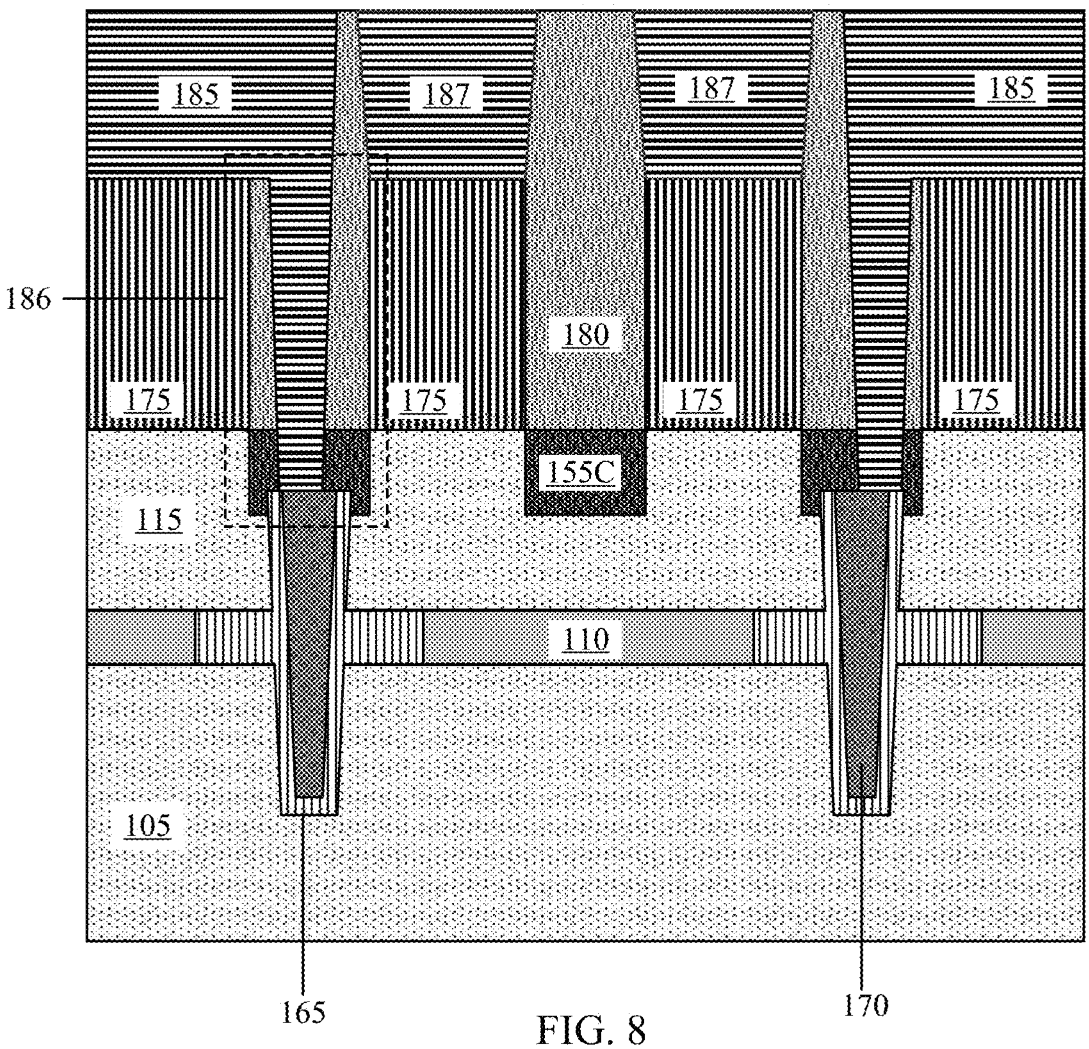
FIG. 8 illustrates a cross section of the nano device after formation of the source/drain, an interlayer dielectric layer, a second connector, and a third connector, in accordance with the embodiment of the present invention.

FIG. 8 illustrates a cross section of the nano device after formation of the source/drain 175, an interlayer dielectric 180, a second connector 185, and a third connector 187, in accordance with the embodiment of the present invention. The nano stack 117 includes a plurality of sacrificial layers (the second sacrificial layer 120, the third sacrificial layer 130, and the fourth sacrificial layer 140) and a plurality of nanosheets (the first nanosheet 125, the second nanosheet 135, and the third nanosheet 145) are recessed/removed in the source/drain region as illustrated by FIG. 8. After dummy gate and gate spacer formation (not shown), the source/drain 175 is formed in the space where the nano stack 117 are removed between the gates. Prior to the source/drain 175 formation, the exposed second sacrificial layer 120, the third sacrificial layer 130, and the fourth sacrificial layer 140 can be indented with inner spacer formation. The source/drain 175 can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques.

An interlayer dielectric 180 is formed around the source/drain 175 and on top of the shallow trench isolation layer 155C. After that, dummy gate can be removed and replaced with final high-k metal gate (HKMG) (not shown). Then, a second connector 185 is formed on top of some of the source/drain 175 and a third connector 187 is formed on top of some of the source/drain 175. The third connector 187 is for making a frontside connection. The second connector 185 includes a downward extending connector via 186. The connector via 186 extends downwards through the interlayered dielectric 180 and the shallow trench isolation layer 155C to connect with a top surface of the first connector 170. The second connector 185 is for making a backside connection.

Figure 9:
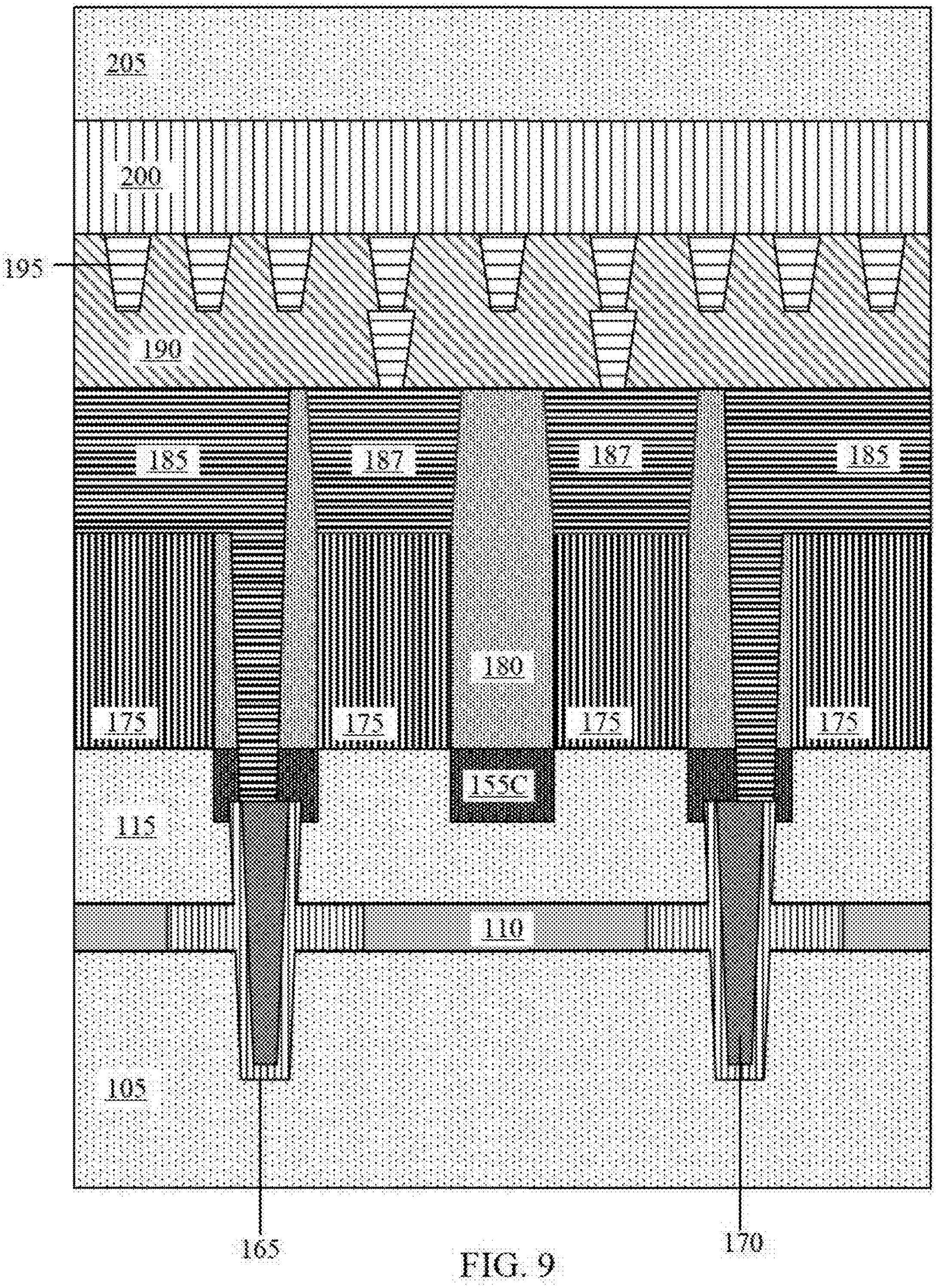
FIG. 9 illustrates a cross section of the nano device after formation of a second interlayer dielectric layer, an upper power network, a transfer layer, and a carrier substrate, in accordance with the embodiment of the present invention.

FIG. 9 illustrates a cross section of the nano device after formation of a second interlayer dielectric 190, the first BEOL metal level 195 with vias underneath to connect first BEOL metal level 195 to middle-of-line (MOL) contacts, and additional BEOL layers 200, and a carrier substrate 205 is bonded over the top surface of the additional BEOL layers 200, in accordance with the embodiment of the present invention. A second interlayer dielectric 190 is formed on top of the second connector 185, the third connector 187 (i.e., middle-of-line contacts), and a portion of the interlayer dielectric 180. The second interlayered dielectric 190 can be the same material as the interlayer dielectric 180 or it can be a different dielectric material. The first BEOL metal level 195 is formed in second interlayer dielectric 190 and connects to the third connector 187. Additional BEOL layers 200 is formed on top of the first BEOL metal level 195 and the second interlayer dielectric 190. A carrier substrate 205 is formed on top of the additional BEOL layers 200. The carrier substrate 205 allow for the nano device to be flipped over so the backside of the nano device can be processed.

Figure 10:
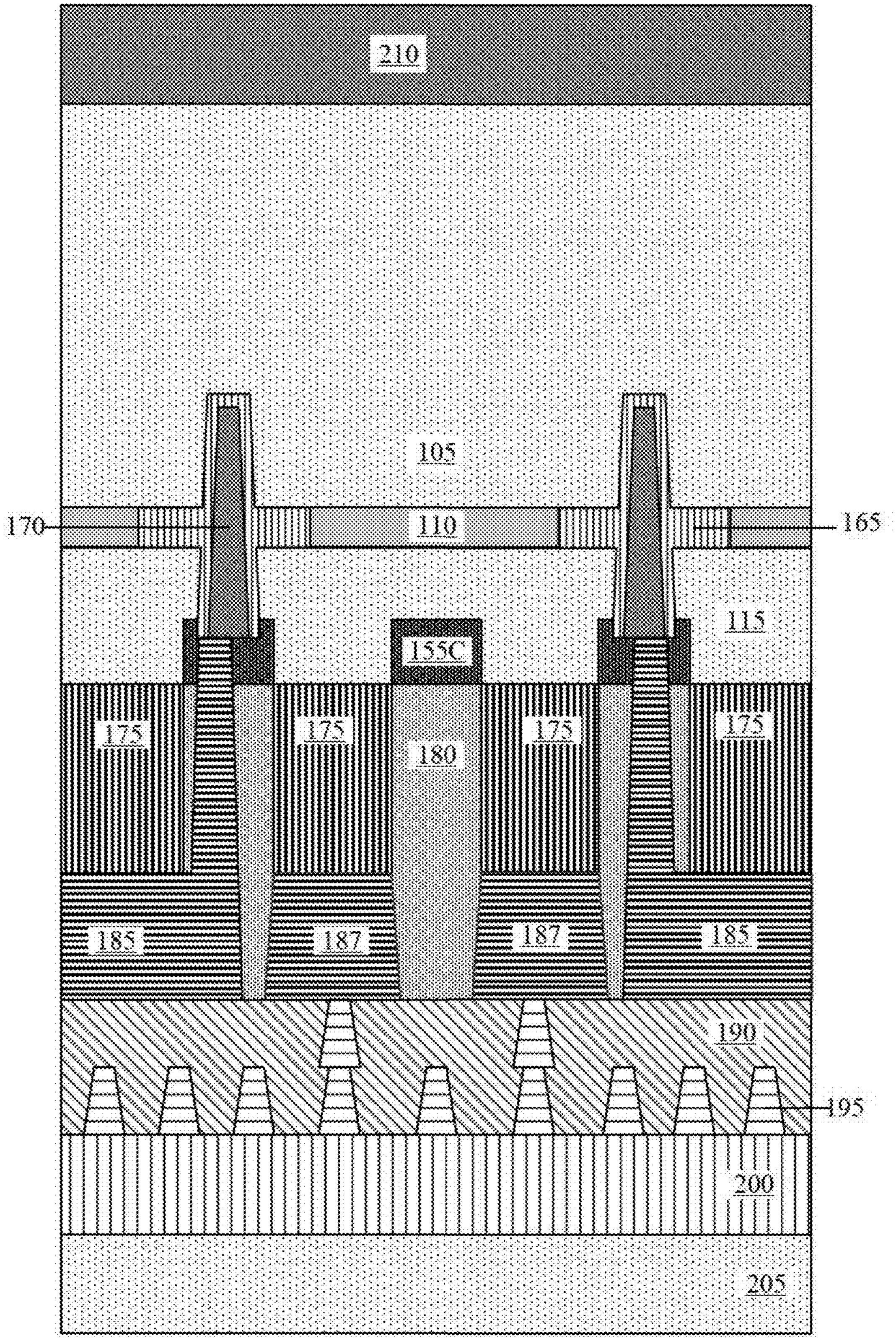
FIG. 10 illustrates a cross section of the nano device after formation of a second hardmask, in accordance with the embodiment of the present invention.
Figure 11:
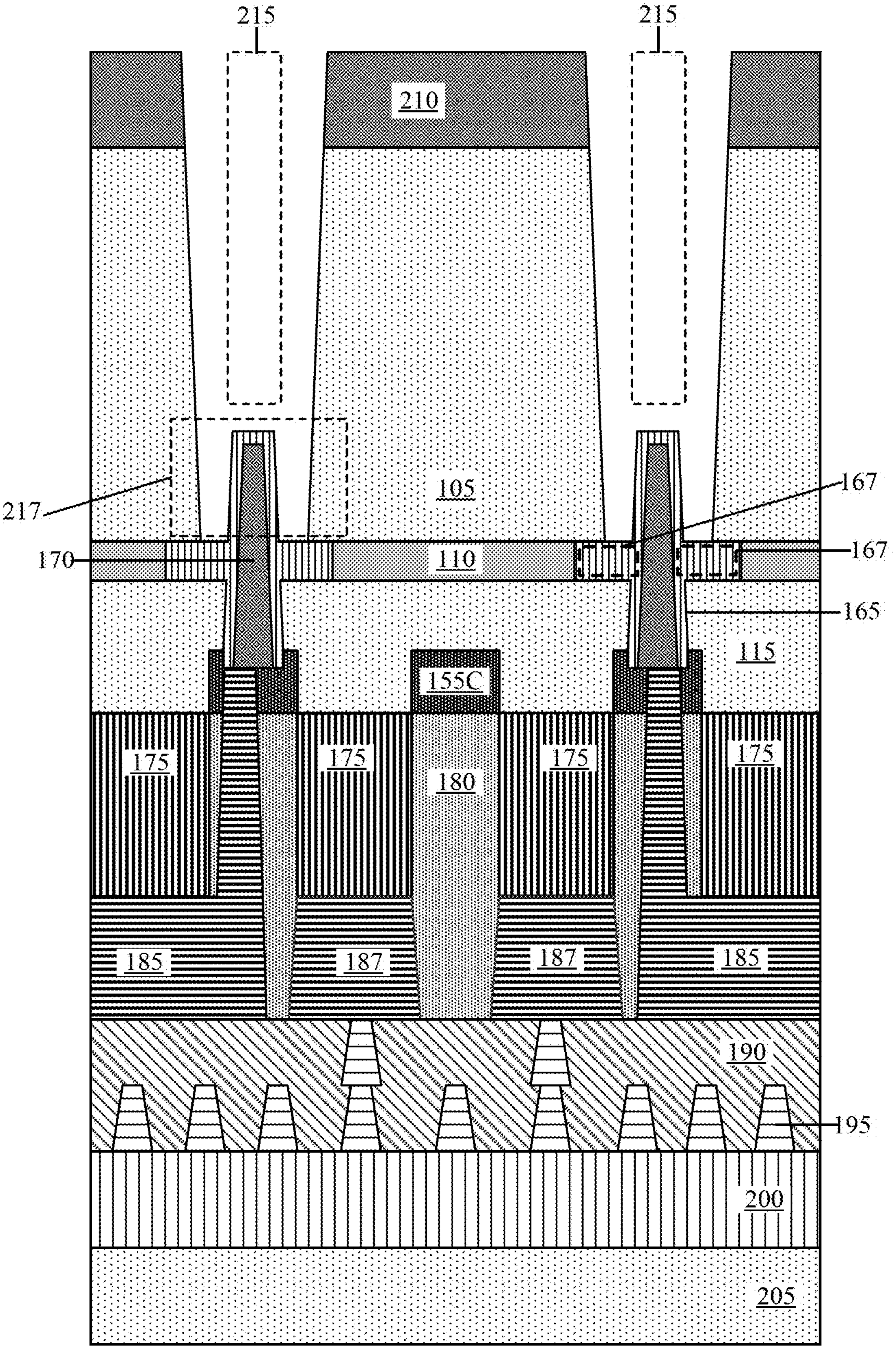
FIG. 11 illustrates a cross section of the nano device after formation of a bottom trench, in accordance with the embodiment of the present invention.

FIG. 10 illustrates a cross section of the nano device after wafer is flipped, substrate thinning, and formation of a second hardmask 210, in accordance with the embodiment of the present invention. The nano device has been flipped over to allow for the backside to be processed. The substrate is thinned down from more than 700 μm to less than 1 μm, or about 100 nm. Optionally, some etch stop layer can be used in the initial substrate to facilitate the substrate thinning process. After that, a second hardmask 210 is formed on the exposed backside of the substrate 105. FIG. 11 illustrates a cross section of the nano device after formation of a bottom trench 215, in accordance with the embodiment of the present invention. The second hardmask 210 and the substrate 205 are patterned to form the bottom trench 215. The bottom trench 215 extends downwards from the top surface of the second hardmask 210 to expose a surface of the dielectric landing pad 167. The bottom trench 215 exposes portions of the dielectric liner 165 that extended past the dielectric landing pad 167, as illustrated by dashed box 217. The dielectric landing pad 167 acts as an etch stop preventing over etching the bottom trench 215, thus preventing damage to the nano device. The width of the dielectric landing pad 167 allows for the formation of a wider bottom trench 215, which makes it easier to align the backside power via 225 with the first connector 170.

Figure 12:
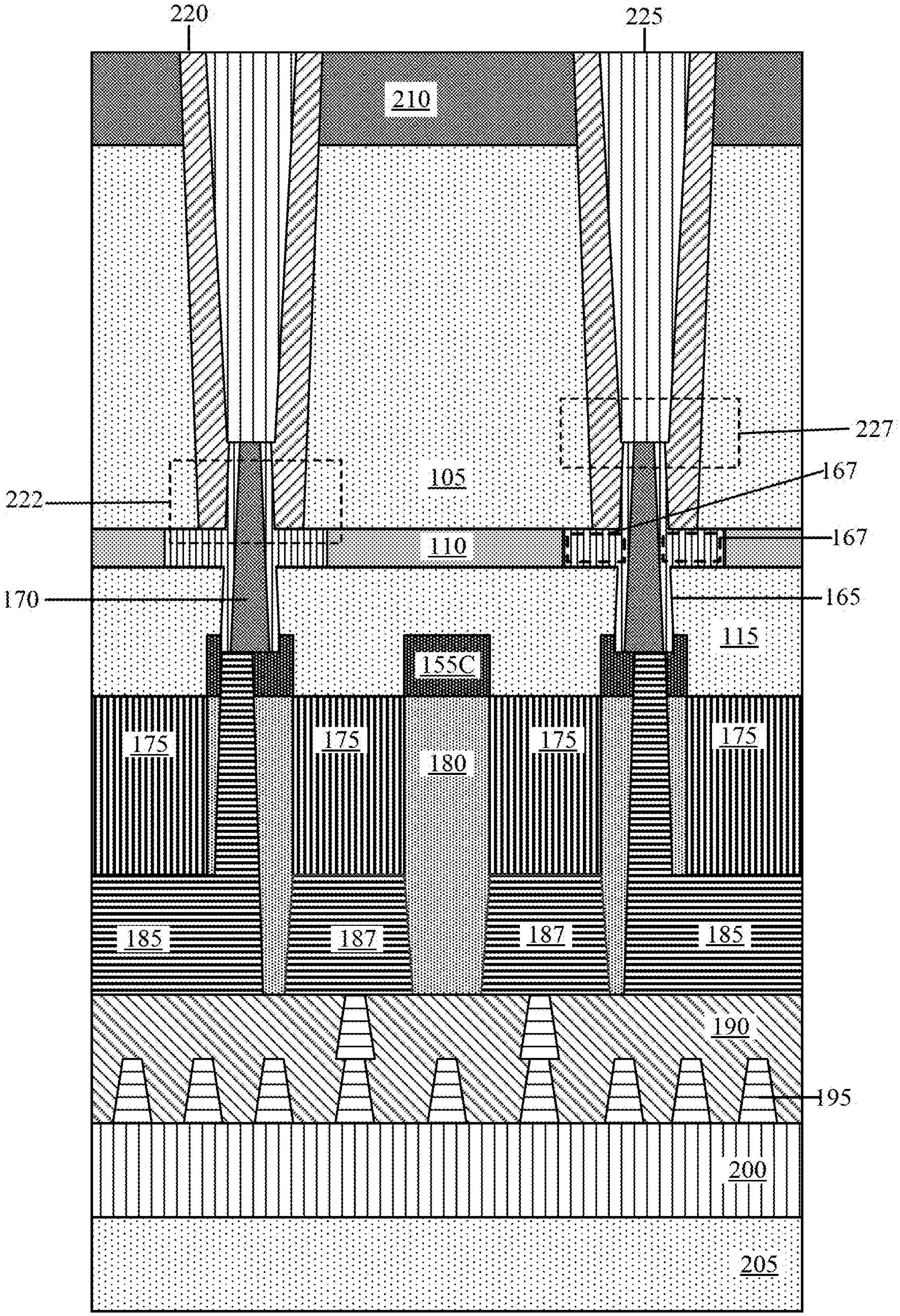
FIG. 12 illustrates a cross section of the nano device after formation of a second dielectric liner and bottom contact, in accordance with the embodiment of the present invention.

FIG. 12 illustrates a cross section of the nano device after formation of a second dielectric liner 220 and backside power via 225, in accordance with the embodiment of the present invention. A second dielectric liner 220 is formed in the bottom trench 215. The second dielectric liner 220 surrounds a portion of the first dielectric liner 165 that extends into the bottom trench 215, as illustrated by dashed box 222. A backside power via 225 is formed within the bottom trench 215, wherein the backside power via 225 extends downwards to connect with a surface of the first connector 170, as illustrated by dashed box 227. A backside power network (not shown) is formed and connected to the backside power via 225.

Figure 13:
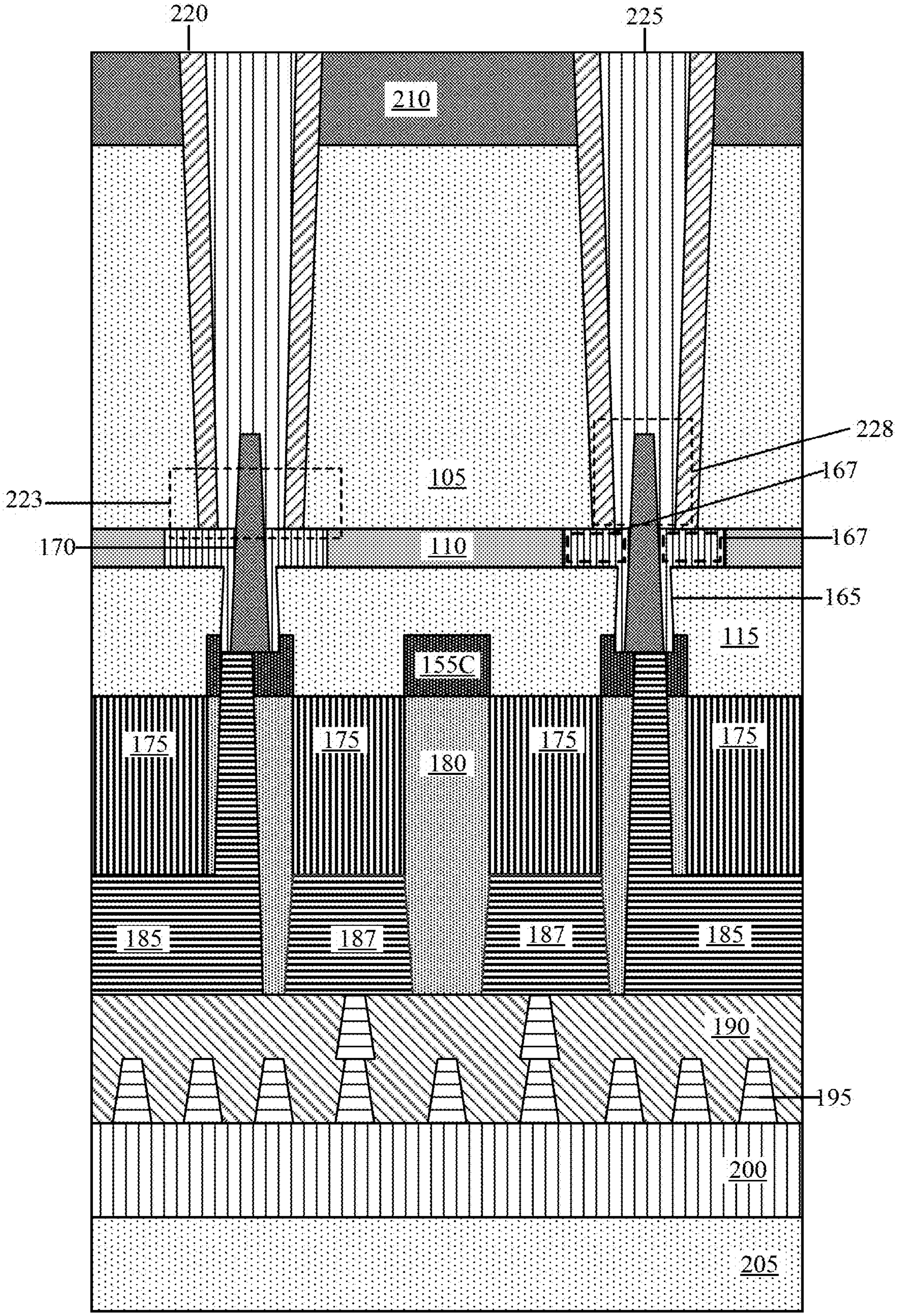
FIG. 13 illustrates a cross section of the nano device after formation of a second dielectric liner and bottom contact, in accordance with the embodiment of the present invention.

FIG. 13 illustrates a cross section of the nano device after formation of a second dielectric liner 220 and backside power via 225, in accordance with the embodiment of the present invention. The portions of the dielectric liner 165 that extends into the bottom trench 215 can be removed to expose portions of the first connector 170. A second dielectric liner 220 is formed in the bottom trench 215. The second dielectric liner 220 extends along the sidewalls of the bottom trench 215 to contact a surface of the dielectric landing pad 167, as illustrated by dashed box 223. A backside power via 225 is formed within the bottom trench 215, wherein the backside power via 225 extends downwards to connect with a surface of the first connector 170, as illustrated by dashed box 228. Since portions of the dielectric liner 165 were removed which increased the exposed surface area of the first connector 170. The backside power via 225 can make contact with multiple surfaces of the first connector 170. A backside power network (not shown) is formed and connected to the backside power via 225.

Figure 14:
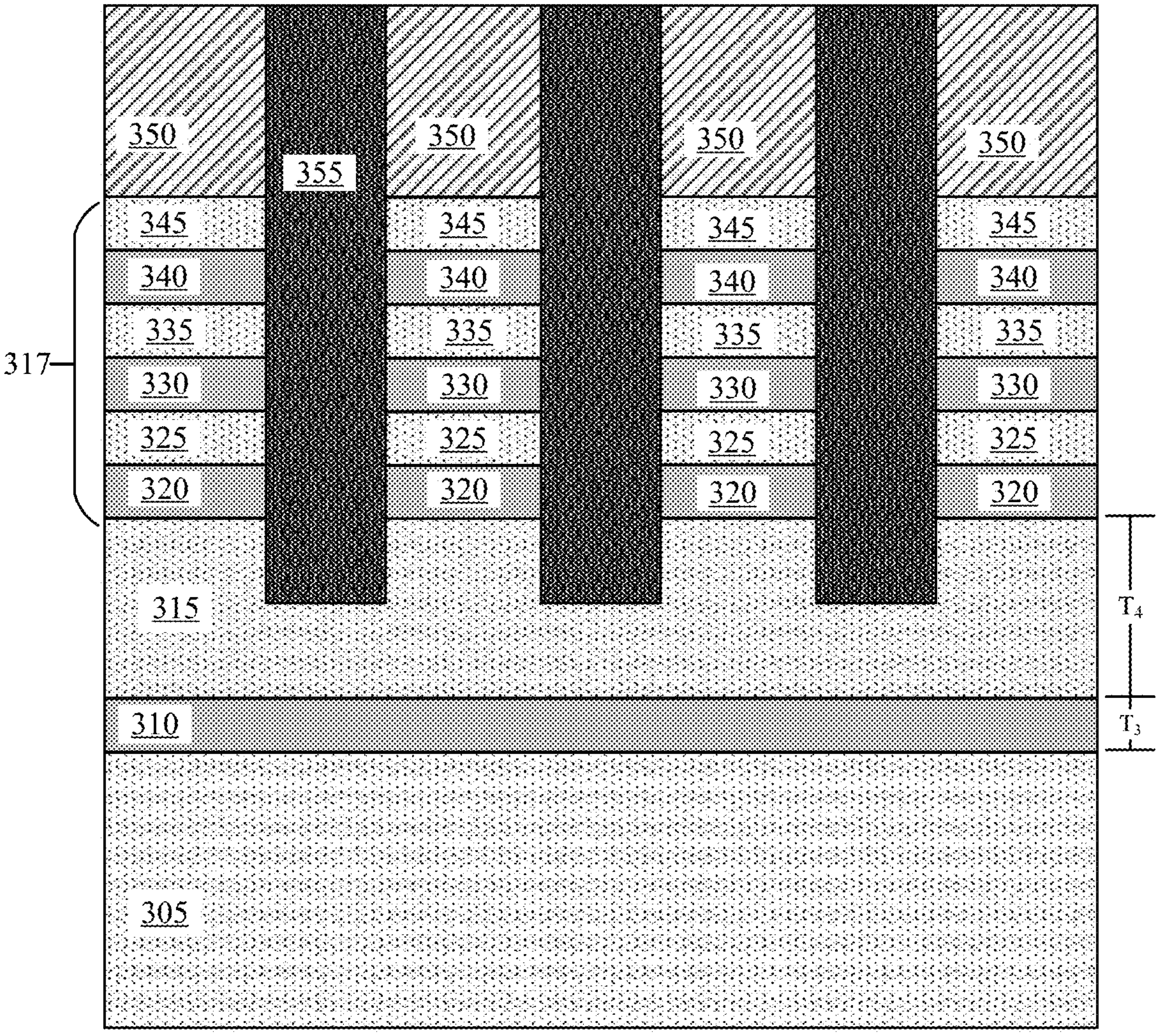
FIG. 14 illustrates a cross section of the nano device after the formation of a shallow trench isolation layer, in accordance with the embodiment of the present invention.

FIG. 14 illustrates a cross section of the nano device after the formation of a shallow trench isolation layer 355, in accordance with the embodiment of the present invention.

The nano device includes a substrate 305, a first sacrificial layer 310, a second substrate layer 315, and a nano stack 317. The substrate 305 and the second substrate layer 315 can be, for example, a material including, but not necessarily limited to, silicon (Si), silicon germanium (SiGe), Si:C (carbon doped silicon), carbon doped silicon germanium (SiGe:C), III-V, II-V compound semiconductor or another like semiconductor. In addition, multiple layers of the semiconductor materials can be used as the semiconductor material of the substrate 305. In some embodiments, the substrate 305 and the second substrate layer 315 includes both semiconductor materials and dielectric materials. The semiconductor substrate 305 and the second substrate layer 315 may also comprise an organic semiconductor or a layered semiconductor such as, for example, Si/SiGe, a silicon-on-insulator or a SiGe-on-insulator. A portion or the entire semiconductor substrate 105 may also be comprised of an amorphous, polycrystalline, or monocrystalline. The semiconductor substrate 305 and the second substrate layer 315 may be doped, undoped or contain doped regions and undoped regions therein.

The first sacrificial layer 310 is formed on top of the substrate 305. The first sacrificial layer 310 has a thickness $T_3$. The first sacrificial layer 310 can be comprised of, for example, SiGe, where Ge is in the range of about 15% to 35%. The second substrate layer 315 is formed on top of the first sacrificial layer 310. The second substrate layer 315 has a thickness of $T_4$, where the thickness $T_4$ is larger than thickness $T_3$. The nano stack 317 is formed on top of the second substrate layer 315. The nano stack 317 includes a plurality of sacrificial layers and a plurality of nanosheets. The plurality of sacrificial layers includes the second sacrificial layer 320, the third sacrificial layer 330, and the fourth sacrificial layer 340. Each of the sacrificial layers of the plurality of sacrificial layers can be comprised of, for example, SiGe, where Ge is in the range of about 15% to 35%. The plurality of nanosheets can include the first nanosheet 325, the second nanosheet 335, and the third nanosheet 345. The first nanosheet 325, the second nanosheet 335, and the third nanosheet 345 can be comprised of, for example, Si. The number of nanosheets and sacrificial layers illustrated here is for example purposes only. There can be more or fewer nanosheets and sacrificial layers then the number that is illustrated in FIG. 14 or described herein.

A hardmask 350 is formed on top of the third nanosheet 345. The patterning forms trenches in the nano stack 317, so that the nano stack 317 is cut into a plurality of columns. The trenches extend downwards into the second substrate layer 315. The trenches do not reach the first sacrificial layer 310. A shallow trench isolation layer 355 is formed in the trenches between the columns.

Figure 15:
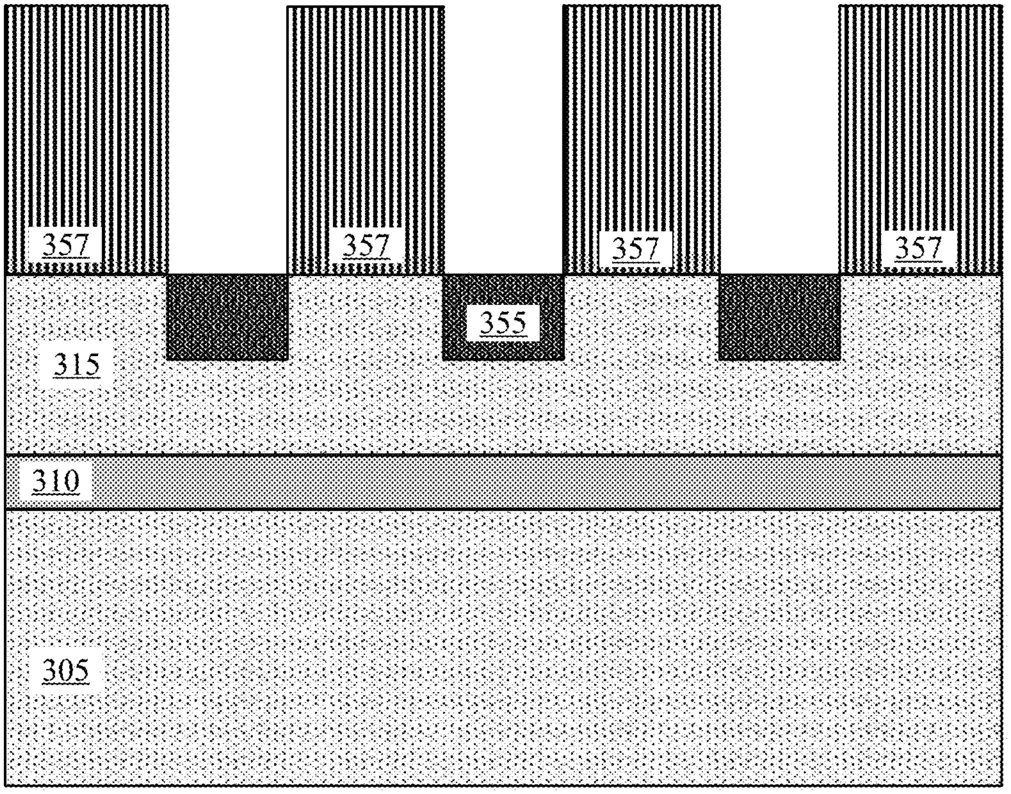
FIG. 15 illustrates a cross section of the nano device after the formation of a source/drain and the etching of the shallow trench isolation layer, in accordance with the embodiment of the present invention.

FIG. 15 illustrates a cross section of the nano device after formation of shallow trench isolation layer, the dummy gate and gate spacer (not shown), and the formation of a source/drain in accordance with the embodiment of the present invention. The nano stack 317 includes a plurality of sacrificial layers (the second sacrificial layer 320, the third sacrificial layer 330, and the fourth sacrificial layer 340) and a plurality of nanosheets (the first nanosheet 325, the second nanosheet 335, and the third nanosheet 345) are recessed/removed at the source/drain region illustrated by FIG. 14. Prior to the source/drain formation, the exposed sacrificial SiGe layer can be indented and filled with inner spacer (not shown), and the source/drain 357 is formed in the space where the nano stack 317 are removed. The source/drain 357 can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques.

Figure 16:
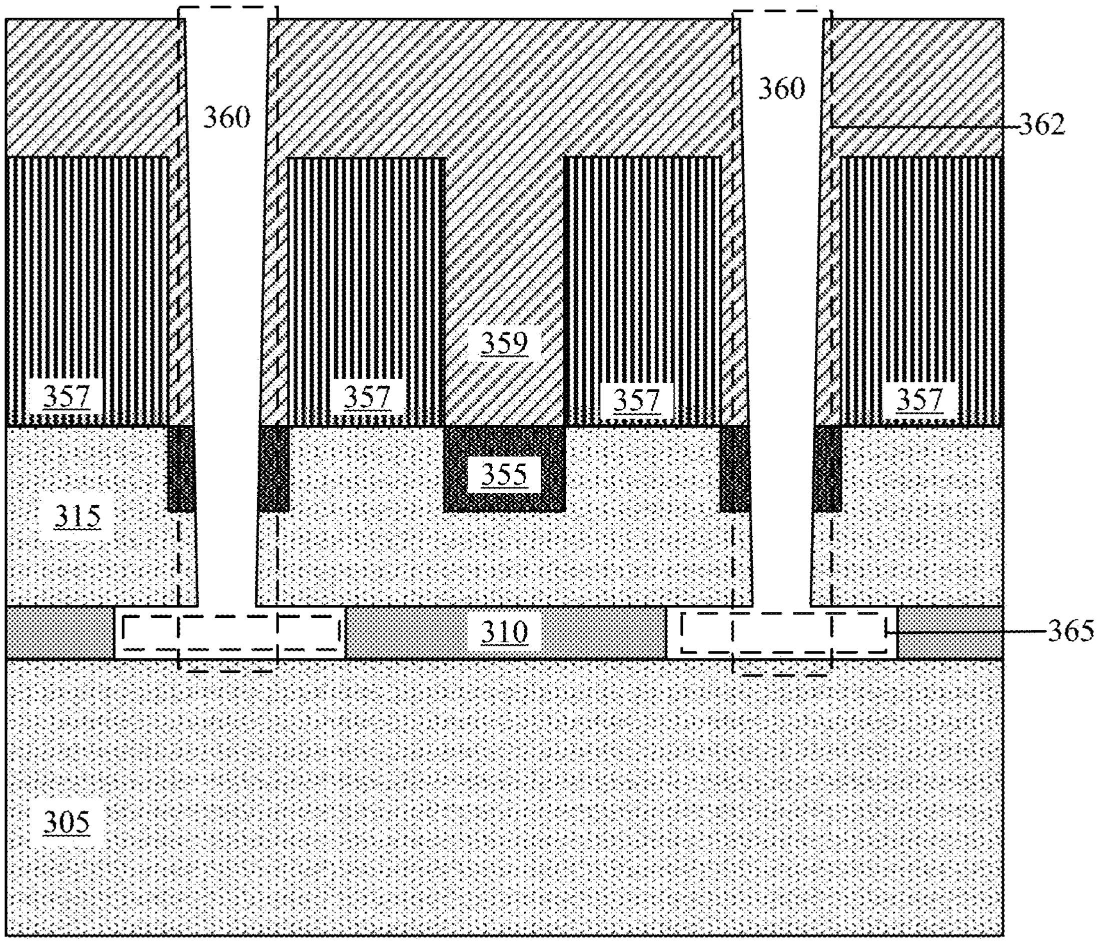
FIG. 16 illustrates a cross section of the nano device after the formation of a contact trench and the recessing of the first sacrificial layer, in accordance with the embodiment of the present invention.

FIG. 16 illustrates a cross section of the nano device after the formation of ILD, replacement gate (not shown), and a middle-of-line contact trench 360 and the recessing of the first sacrificial layer 310, in accordance with the embodiment of the present invention. An interlayered dielectric 359 is formed around the source/drains 357. A middle-of-line contact trench 360 is formed in the interlayered dielectric 359, such that the contact trench 360 extends downwards between source/drains 357 though the shallow trench isolation layer 355 and the second substrate layer 315 into the first sacrificial layer 310. The first sacrificial layer 310 is recessed to create voids 365. A difference between the embodiment illustrated in FIG. 16 and FIG. 5 is when the trenches are formed and the depth of the trenches. The middle-of-line contact trench 360 as illustrated by FIG. 16 does not extend past the first sacrificial layer 310, while the first trench 160 extends past the first sacrificial layer 110 as illustrated by FIG. 5.

Figure 17:
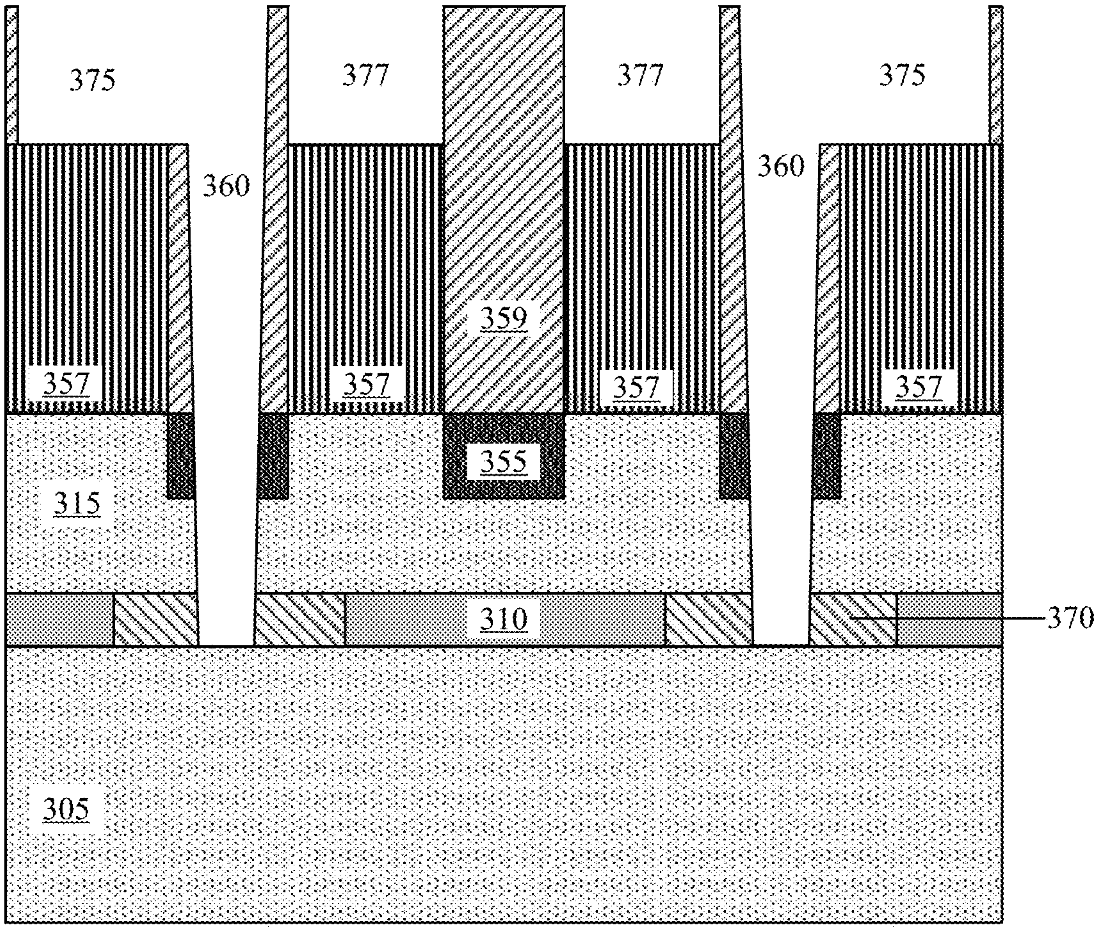
FIG. 17 illustrates a cross section of the nano device after the formation of dielectric landing pad and formation of contact cuts, in accordance with the embodiment of the present invention.

FIG. 17 illustrates a cross section of the nano device after the formation of dielectric landing pad 370 and formation of contact, in accordance with the embodiment of the present invention. The void 365 are filled with a dielectric material to form dielectric landing pads 370. The interlayer dielectric 359 is etched to create a plurality of contact trenches. A second contact trench 377 are formed on top of some of the source/drain 357. The second contact trench 377 allows for a formation of a frontside contact. A third contact trench 375 are formed on top of some of the source/drain 357 and the third contact trench 375 connects to the contact trench 360. The third contact trench 375 combined with the contact trench 360 allows for the formation of backside contact.

Figure 18:
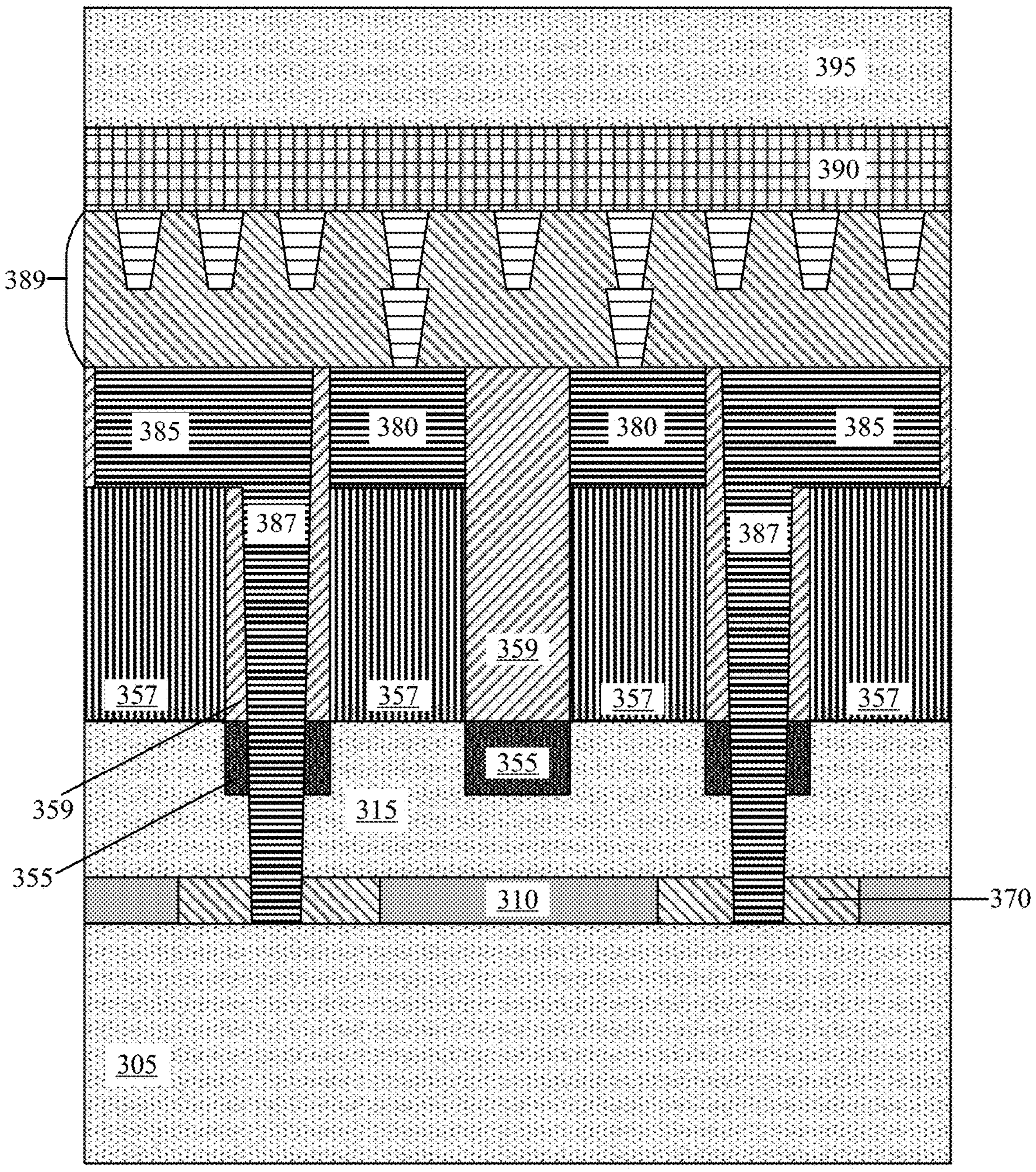
FIG. 18 illustrates a cross section of the nano device after the formation of contacts, a transfer layer, and a carrier substrate, in accordance with the embodiment of the present invention.

FIG. 18 illustrates a cross section of the nano device after the formation of first BEOL layer, additional BEOL layers 390, and a carrier substrate 395, in accordance with the embodiment of the present invention. The contact trench 360, the second contact trench 377, and the third contact trench 375 are filled with a contact material, for example, a conductive metal to form a first contact 380 and a second contact 385. The conductive material fills the contact trench 360 to form the contact via 387. The contact via 387 extends through the dielectric landing pad 370 but does not extend past it. The interlayer dielectric 359, the shallow trench isolation layer 355, and the second substrate layer 315 are in direct contact with a sidewall of the contact via 387. The bottom surface of the contact via 387 substantially forms a uniform surface with the bottom of the dielectric landing pad 370. The first metal liner level 389 is formed and connected to the first contact 380. Additional BEOL interconnect layers 390 is formed on top of the first metal liner level 389 and a carrier substrate 395 is bonded to the top of the additional BEOL layers 390. The carrier substrate 395 allows for the nano device to be flip over to allow for the backside of the nanodevice to be processed.

Figure 19:
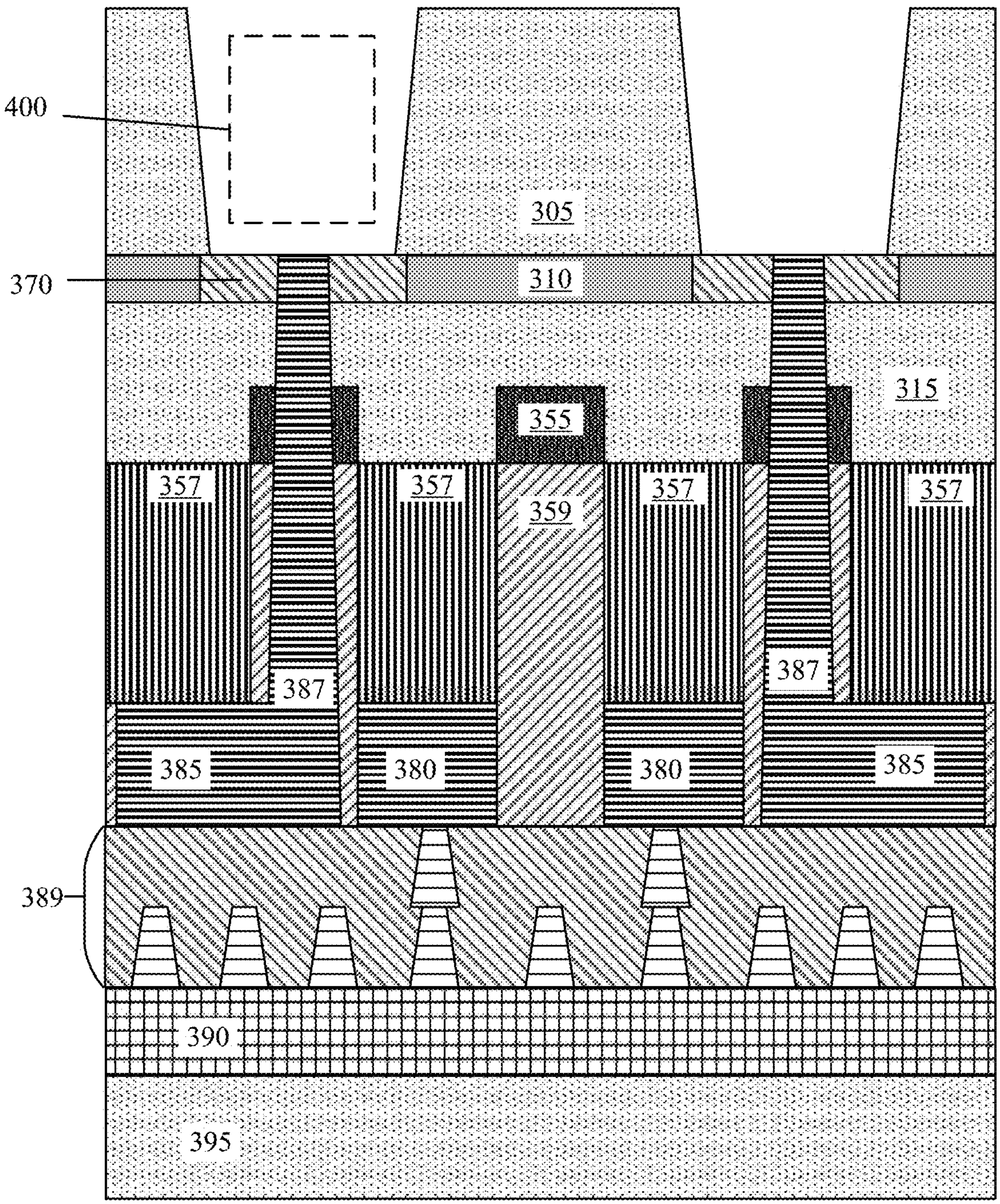
FIG. 19 illustrates a cross section of the nano device after the formation of backside contact trench, in accordance with the embodiment of the present invention.

FIG. 19 illustrates a cross section of the nano device after the formation of backside contact trench 400, in accordance with the embodiment of the present invention. The nano device is flip over to allow for the processing of the backside of the nano device. The substrate is thinned down. A backside power rail trench 400 is formed in the substrate 305, where the backside power rail trench 400 exposes the bottom surface of the dielectric landing pad 370 and the bottom surface of the contact via 387. The dielectric landing pad 370 acts as an etch stop when forming the backside contact trench 400. The dielectric landing pad 370 allows for the formation of wide backside power rail trenches 400 to be formed without damaging the underlying nano device.

Figure 20:
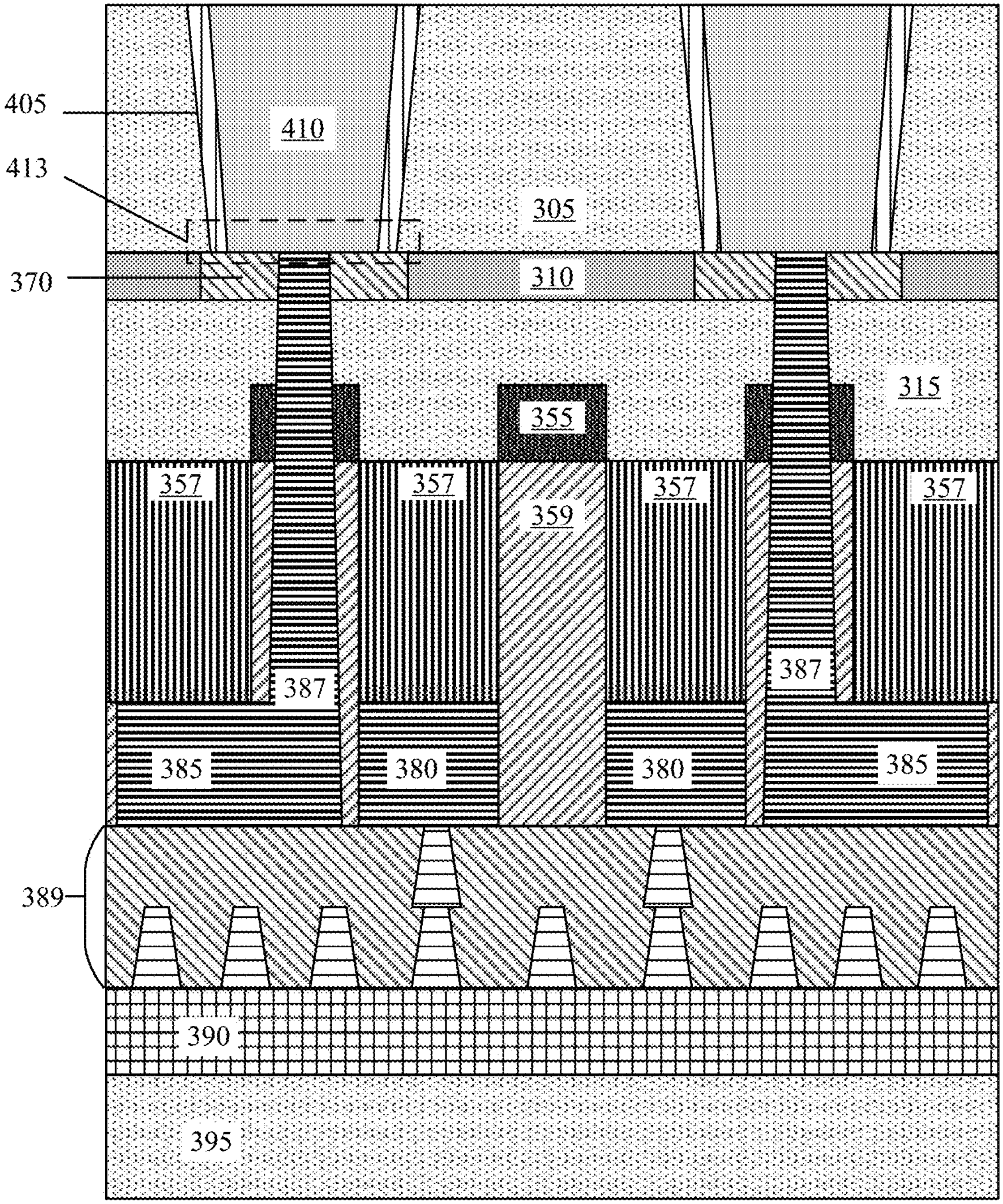
FIG. 20 illustrates a cross section of the nano device after the formation of a dielectric contact liner and a bottom contact, in accordance with the embodiment of the present invention.
Figure 21:
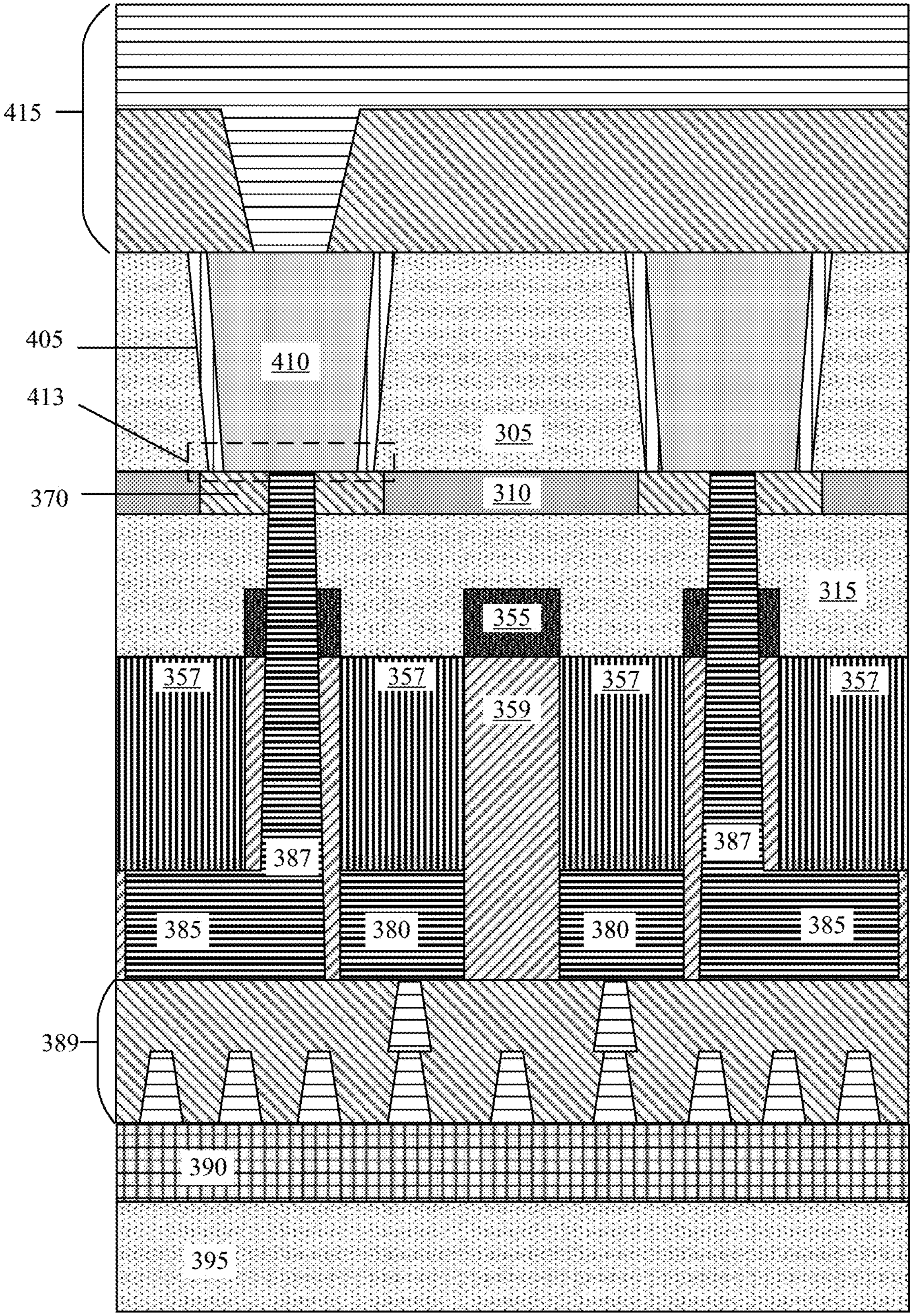
FIG. 21 illustrates a cross section of the nano device after the formation of a backside power network, in accordance with the embodiment of the present invention.

FIG. 20 illustrates a cross section of the nano device after the formation of a dielectric contact liner 405 and a bottom power rail 410, in accordance with the embodiment of the present invention. A dielectric contact liner 405 is formed in the backside power rail trench 400. A conductive material is used to fill the remaining space within the backside power rail trench 400 to form the backside power rail 410. The dielectric contact liner 405 and the backside power rail 410 are both in contact with the bottom surface of the dielectric landing pad 370. FIG. 21 illustrates a cross section of the nano device after the formation of a backside power network 415, in accordance with the embodiment of the present invention. A backside power network 415 in formed on top of the backside power rail 410, the dielectric contact liner 405, and the substrate 305.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A semiconductor comprising:
a sacrificial layer located directly between a first substrate layer and a second substrate layer, wherein the sacrificial layer has a first thickness, wherein the second substrate layer has a second thickness, wherein the second thickness is larger than the first thickness;
a source/drain located on top of the second substrate layer;
a dielectric landing pad located within the sacrificial layer, wherein the dielectric landing pad extends horizontally within a void of the sacrificial layer, wherein the dielectric landing pad fills the entire void within the sacrificial layer;
a vertical dielectric liner that extends off the dielectric landing pad, wherein the dielectric landing pad is integrally formed with the vertical dielectric liner;
a frontside contact comprised of a first section and a second section, wherein the first section of the frontside contact is located on top of the source/drain, wherein the second section of the frontside contact is a via that extends downwards past and through the dielectric landing pad, wherein the vertical dielectric liner extends along a vertical sidewall of the second section of the frontside contact.

2. The semiconductor of claim 1, further comprising:
a backside connector extending from a backside power network towards a portion of the second section of the frontside contact that extends below a bottom surface of the dielectric landing pad.

3. The semiconductor of claim 2, wherein the backside connector is in contact with a backside surface of the dielectric landing pad and the portion of the second section of the frontside contact that extends below the bottom surface of the dielectric landing pad.

4. The semiconductor of claim 3, wherein the backside connector is comprised of a first dielectric liner and a conductive metal.

5. The semiconductor of claim 4, wherein the first dielectric liner is in direct contact with the bottom surface of the dielectric landing pad, and wherein the conductive metal is in direct contact with a bottom surface of the second section of the first contact that extends below the bottom surface of the dielectric landing pad.

6. The semiconductor of claim 1, wherein the vertical dielectric liner does not extend past the backside surface of the dielectric landing pad.

7. The semiconductor of claim 6, wherein the conductive metal of the backside contact is in direct contact with a sidewall of the of the second section of the first contact that extends below the bottom surface of the dielectric landing pad.

8. The semiconductor of claim 7, wherein the conductive metal of the backside contact is in direct contact with the bottom surface of the dielectric landing pad.

9. A semiconductor comprising:

a sacrificial layer located directly between a first substrate layer and a second substrate layer;

a source/drain located on top of the second substrate layer;

a dielectric landing pad located within the sacrificial layer, wherein the dielectric landing pad extends horizontally within a void of the sacrificial layer, wherein the dielectric landing pad has a first surface that is in direct contact with the first substrate layer, a second surface that is in direct contact with the second substrate layer, and a third surface that is in contact with the sacrificial layer, wherein the dielectric landing pad is comprised of a vertical continuous material between the first and second surface;

a frontside contact located on top of the source/drain, wherein the frontside contact further extends downwards past the source/drain;

a connector that is in contact with a backside surface of the frontside contact and the connector extends through the dielectric landing pad.

10. The semiconductor of claim 9, wherein the connector extends past a backside surface of the dielectric landing pad.

11. The semiconductor of claim 10, further comprising:

a backside connection via in contact with the connector.

12. The semiconductor of claim 11, wherein the backside connection via is in contact with multiple surfaces of the connector.

13. The semiconductor of claim 12, wherein the backside connection via is in contact with the backside surface of the dielectric landing pad.

14. The semiconductor of claim 13, wherein the second substrate is in contact with the backside surface of the dielectric landing pad.

15. The semiconductor of claim 9, wherein the sacrificial layer is in contact with a vertical sidewall of the dielectric landing pad.

* * * * *